(12) United States Patent
Yang

(10) Patent No.: US 11,764,191 B2
(45) Date of Patent: Sep. 19, 2023

(54) METHOD FOR PREPARING SEMICONDUCTOR PACKAGE HAVING MULTIPLE VOLTAGE SUPPLY SOURCES

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 116 days.

(21) Appl. No.: 17/517,556

(22) Filed: Nov. 2, 2021

(65) Prior Publication Data
US 2022/0059507 A1  Feb. 24, 2022

Related U.S. Application Data

(62) Division of application No. 16/867,202, filed on May 5, 2020, now Pat. No. 11,222,871.

(51) Int. Cl.
*H01L 25/065* (2023.01)
*H01L 25/00* (2006.01)

(52) U.S. Cl.
CPC .......... *H01L 25/0657* (2013.01); *H01L 25/50* (2013.01); *H01L 2225/0651* (2013.01); *H01L 2225/06517* (2013.01); *H01L 2225/06527* (2013.01); *H01L 2225/06586* (2013.01)

(58) Field of Classification Search
CPC .................................................. H01L 25/0657
See application file for complete search history.

(56) References Cited

U.S. PATENT DOCUMENTS

2019/0074265 A1*  3/2019  Kushida ................. H01L 24/06

FOREIGN PATENT DOCUMENTS

TW  I688017 B  3/2020
TW  202017147 A  5/2020

OTHER PUBLICATIONS

Office Action dated Apr. 6, 2022 related to Taiwanese Application No. 110113609.
Translation of Office Action dated Apr. 6, 2022 related to Taiwanese Application No. 110113609.

* cited by examiner

*Primary Examiner* — Yu-Hsi D Sun
(74) *Attorney, Agent, or Firm* — Xuan Zhang

(57) ABSTRACT

The present application provides a method for preparing a semiconductor package The method includes bonding a bottom device die onto a package substrate; attaching a top device die onto the bottom device die; attaching an additional package substrate onto the top device die; establishing electrical connection between the additional package substrate and the top device die, between the additional package substrate and the package substrate, and between the top device die and the package substrate; and encapsulating the bottom device die, the top device die and the additional package substrate by an encapsulant.

5 Claims, 20 Drawing Sheets

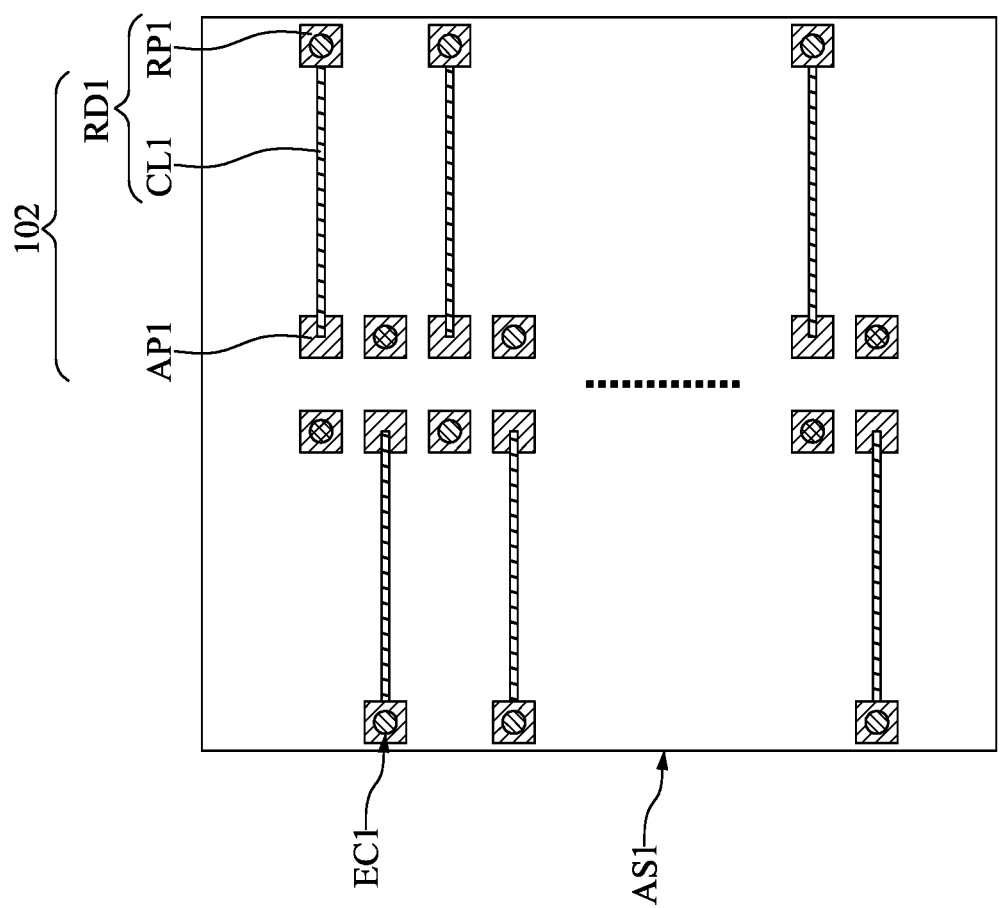

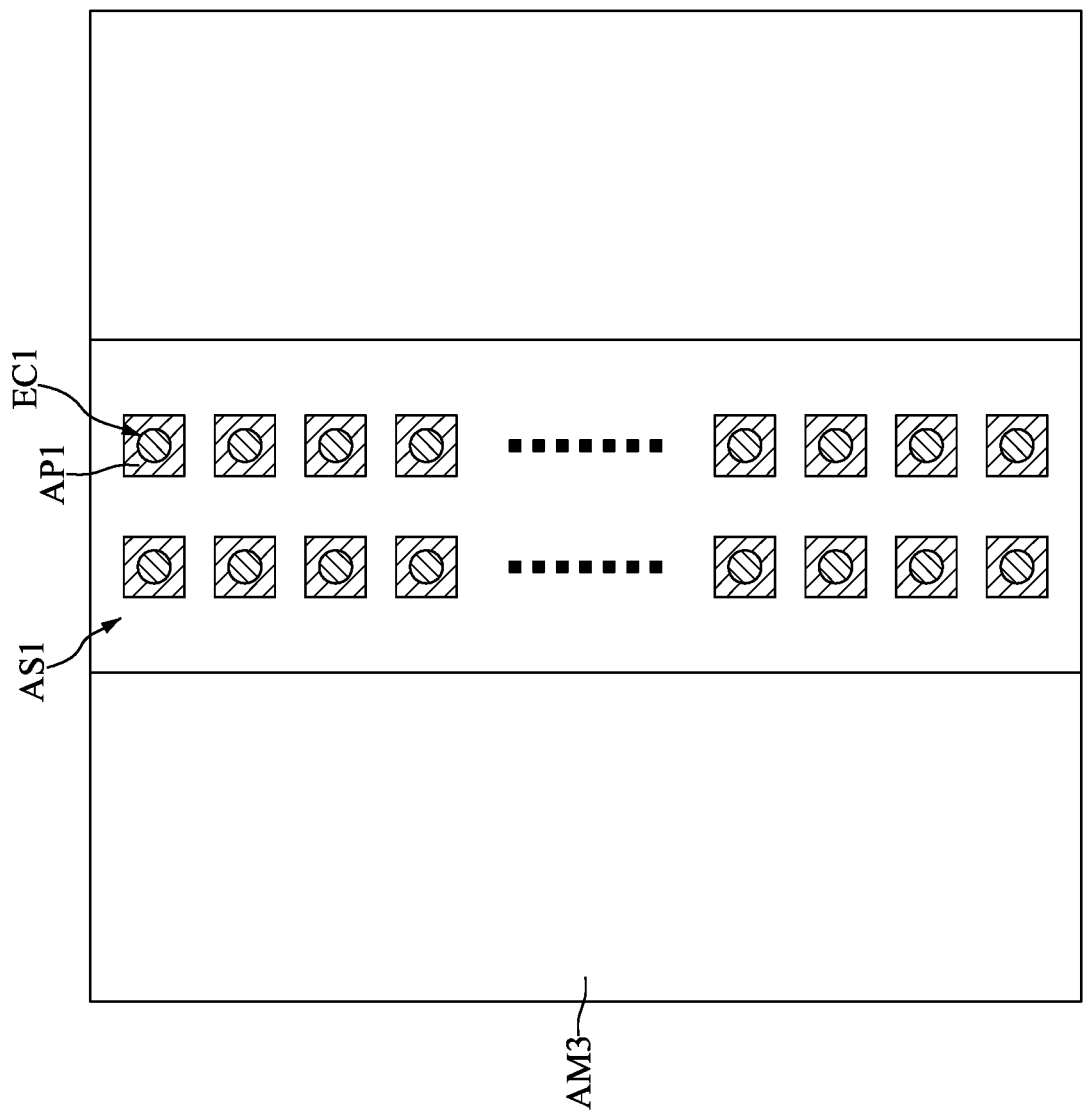

METHOD FOR PREPARING SEMICONDUCTOR PACKAGE HAVING MULTIPLE VOLTAGE SUPPLY SOURCES

CROSS-REFERENCE TO RELATED APPLICATION

This application is a divisional application of U.S. Non-Provisional application Ser. No. 16/867,202 filed May 5, 2020, which is incorporated herein by reference in its entirety.

TECHNICAL FIELD

The present disclosure relates to a method for preparing a semiconductor package, and more particularly, to a method for preparing a multi-die semiconductor package.

DISCUSSION OF THE BACKGROUND

The semiconductor industry has experienced continuous growth due to constant improvement in integration density of various electronic components. This improvement has been primarily based on repeated reductions in minimum feature size, allowing more components to be integrated into a given chip area.

Such integration improvement is essentially two-dimensional (2D) in nature, in that the volume occupied by the integrated components is essentially on the surface of semiconductor wafer. Although dramatic improvements in lithography have resulted in considerable improvement in 2D integrated circuit formation, there are physical limitations to the density that can be achieved in two dimensions. While 2D scaling remains an option for new designs, adopting three-dimensional (3D) packaging schemes that utilize the z-direction has become a focus of research in the industry. In a 3D package structure, multiple semiconductor dies are stacked on one another. As a consequence, a signal path between an upper semiconductor die and inputs/outputs (I/Os) of the 3D package structure is longer than a signal path between a lower semiconductor die and the I/Os, thus signal transmission time of the upper semiconductor die may be delayed. In addition, signal loss between the top upper semiconductor die and the I/Os may be increased due to greater impedance of the relatively long signal path.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In an aspect of the present disclosure, a semiconductor package is provided. The semiconductor package comprises: a package substrate; a bottom device die, attached on the package substrate; a top device die, attached on the bottom device die, wherein an active side of the top device die faces away from the package substrate, a back side of the top device die faces toward the package substrate, the top device die comprises die inputs/outputs (I/Os) at the active side, and a first portion of the die I/Os are electrically connected to the package substrate; and an additional package substrate, attached on the active side of the top device die, wherein the additional package substrate is electrically connected to a second portion of the die I/Os of the top device die, and electrically connected to the package substrate.

In some embodiments, the additional package substrate is electrically connected to the second portion of the die I/Os by first bonding wires, and the additional package substrate is electrically connected to the package substrate by second bonding wires.

In some embodiments, the additional package substrate has an opening and a body portion laterally surrounding the opening.

In some embodiments, the second portion of the die I/Os are overlapped with the opening, and the first bonding wires extend from a top surface of the additional package substrate to the second portion of the die I/Os through the opening of the additional package substrate.

In some embodiments, the second bonding wires extend from a peripheral region of a top surface of the additional package substrate to the package substrate.

In some embodiments, the first portion of the die I/Os are at least partially located outside a span of the additional package substrate.

In some embodiments, the first portion of the die I/Os are electrically connected to the package substrate by third bonding wires.

In some embodiments, the semiconductor package according further comprises: a first adhesive material disposed between the bottom device die and the top device die; and a second adhesive material disposed between the top device die and the additional package substrate.

In some embodiments, the second adhesive material has an opening and a body portion laterally surrounding the opening of the additional package substrate, and the opening of the second adhesive material is overlapped with the second portion of the die I/Os.

In some embodiments, the additional package substrate is configured to provide a power voltage and a reference voltage to the top device die, and the package substrate is configured to provide commands to an integrated circuit in the top device die.

In some embodiments, the semiconductor package further comprises: an encapsulant disposed on the package substrate, and encapsulating the bottom device die, the top device die and the additional package substrate.

In some embodiments, the semiconductor package further comprises: package I/Os disposed at a surface of the package substrate facing away from the bottom device die.

In another aspect of the present disclosure, a semiconductor package is provided. The semiconductor package comprises: a first package substrate; a first device die, bonded onto the first package substrate, and having a first active side facing toward the first package substrate and a first back side facing away from the first active side; a second device die, attached on the first device die, and having a second active side facing away from the first device die and a second back side facing toward the first device die; a second package substrate, attached on the second active side of the second device die, wherein die inputs/outputs (I/Os) of the second device die at the second active side are electrically connected to the first and second package substrates; and an encapsulant, disposed on the first package substrate, and encapsulating the first device die, the second device die and the second package substrate.

In some embodiments, the second package substrate comprises: built-up dielectric layers and conductive layers alternatively stacked along a vertical direction; bonding pads disposed in openings of a topmost one of the conductive layers; and routing structures connecting the conductive layers except for the topmost one to the bonding pads.

In yet another aspect of the present disclosure, a method for preparing a semiconductor package is provided. The method comprises: bonding a bottom device die onto a package substrate; attaching a top device die onto the bottom device die; attaching an additional package substrate onto the top device die; establishing electrical connection between the additional package substrate and the top device die, between the additional package substrate and the package substrate, and between the top device die and the package substrate; and encapsulating the bottom device die, the top device die and the additional package substrate by an encapsulant.

In some embodiments, the bottom device die is bonded onto the package substrate via a flip chip manner.

In some embodiments, the method for preparing the semiconductor package further comprises: forming electrical connectors on an active side of the bottom device die before bonding the bottom device die onto the package substrate, wherein the electrical connectors connect between the active side of the bottom device die and the package substrate after the bottom device die is bonded onto the package substrate.

In some embodiments, the method for preparing the semiconductor package further comprises: providing a first adhesive material on the bottom device die before the top device die is attached onto the bottom device die.

In some embodiments, the method for preparing the semiconductor package further comprises: providing a second adhesive material on the top device die before the additional package substrate is attached onto the top device die.

In some embodiments, the electrical connection is established by forming bonding wires extending from the additional package to the top device die, from the additional package to the package substrate, and from the top device die to the package substrate.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1B is a schematic plan view of an active side of a bottom device die in the semiconductor package as shown in FIG. 1A.

FIG. 6B is a schematic plan view an active side of a bottom device die in the semiconductor package as shown in FIG. 6A.

DETAILED DESCRIPTION

Figure 1A:
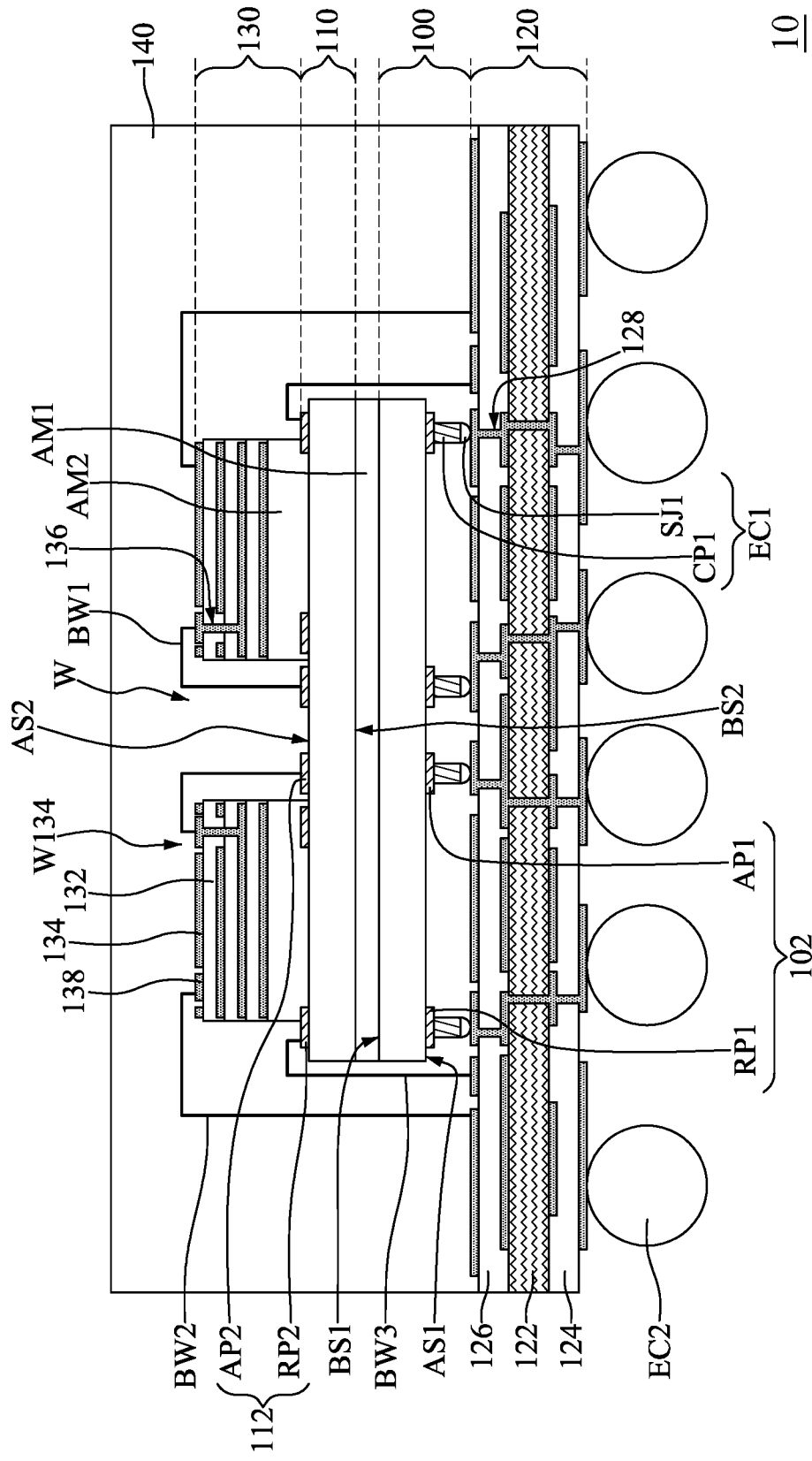
FIG. 1A is a schematic cross-sectional view of a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic cross-sectional view of a semiconductor package 10 according to some embodiments of the present disclosure. FIG. 1B is a schematic plan view of an active side AS1 of a bottom device die 100 in the semiconductor package 10 as shown in FIG. 1A.

Referring to FIG. 1A, in some embodiments, the semiconductor package 10 is a dual-die semiconductor package. In these embodiments, the semiconductor package 10 includes a bottom device die 100 and a top device die 110 stacked on the bottom device die 100. The bottom device die 100 is bonded onto a package substrate 120, and the top device die 110 may be attached on the bottom device die 100 through an adhesive material AM1. In some embodiments, an active side AS1 of the bottom device die 100 faces toward the package substrate 120, while a back side BS1 of the bottom device die 100 faces away from the package substrate 120. On the other hand, an active side AS2 of the top device die 110 faces away from the bottom device die 100, while a back side BS2 of the top device die 110 faces toward the bottom device die 100. In these embodiments, the adhesive material AM1 spreads between the back side BS1 of the bottom device die 100 and the back side BS2 of the top device die 110. In addition, the adhesive material AM1 may cover substantially the entire back side BS1 of the bottom device die 100 and substantially the entire back side BS2 of the top device die 110, and a sidewall of the adhesive material AM1 may be substantially coplanar with or laterally protruded from sidewalls of the bottom and top device dies 100, 110. Alternatively, the sidewall of the adhesive material AM1 may laterally recess from the sidewalls of the bottom and top device dies 100, 110, and may not cover peripheral regions of the back sides BS1, BS2 of the bottom and top device dies 100, 110. In some embodiments, the adhesive material AM1 is composed of a polymer material, such as epoxy.

The active side AS1/AS2 of a device die 100/110 is referred as a side on which die inputs/outputs (I/Os) 102/112 are disposed. In some embodiments, the die I/Os 102 of the bottom device die 100 include conductive pads AP1, and the die I/Os 112 of the top device die 110 include conductive pads AP2. The conductive pads AP1/AP2 are electrically connected to an integrated circuit in the device die 100/110. For instance, the integrated circuit includes active devices and/or passive devices (not shown), and includes interconnections (also not shown) for routing the active and/or passive devices. The conductive pads AP1/AP2 may be connected to the active/passive devices through the interconnections. In some embodiments, the bottom device die 100 and the top device die 110 are memory dies, such as dynamic random access memory (DRAM) dies. In these embodiments, the integrated circuit in each of the bottom device die 100 and the top device die 110 may include an array of memory cells each including at least one access transistor and at least one storage capacitor. In addition, the top device die 110 may be substantially identical to the bottom device die 100 in terms of circuits and dimension. Alternatively, the top device die 110 and the bottom device die 100 may be different from each other in terms of circuits, dimension or other characteristics.

In those embodiments where the active side AS1 of the bottom device die 100 faces toward the package substrate 120, the bottom device die 100 are bonded to the package substrate 120 through electrical connectors EC1. The electrical connectors EC1 connect the die I/Os 102 of the bottom device die 100 to the package substrate 120. In some embodiments, the electrical connectors EC1 respectively include a conductive pillar CP1 and a solder joint SJ1. A terminal of the conductive pillar CP1 is connected to one of the die I/Os 102, and the other terminal of the conductive pillar CP1 is connected to the package substrate 120 through the solder joint SJ1. As shown in FIG. 1A, each conductive pillar CP1 vertically extends between on one of the solder joints SJ and one of the die I/Os 102. In some embodiments, a material of the conductive pillars CP1 may include metal (e.g., copper or copper alloy), while the solder joints SJ1 may be made of a solder material. In addition, the electrical connectors EC1 may have a height in a range from 30 to 150 μm. However, those skilled in the art may select other suitable materials for the electrical connectors EC1 and/or modify dimensions of the electrical connectors EC1 according to design needs, the present disclosure is not limited thereto.

In some embodiments, the package substrate 120 is a package substrate with a dielectric core layer 122. In these embodiments, the package substrate 120 includes the dielectric core layer 122, and includes built-up dielectric layers 124 and layers of conductive patterns 126 alternately formed at opposite sides of the dielectric core layer 122. As shown in FIG. 1A, the built-up dielectric layers 124 and the layers of the conductive patterns 126 may be alternately stacked at a top side and a bottom side of the dielectric core layer 122. The layers of the conductive patterns 126 may include at least one layer of ground plane, at least one layer of power plane and at least one layer of signal plane. For instance, two signal planes span between a ground plane and a power plane. In addition, the package substrate 120 may further include routing structures 128 for routing the embedded layers as well as the bottommost layer of the conductive patterns 126 to a top surface of the package substrate 120, and for routing the embedded layers as well as the topmost layer of the conductive patterns 126 to a bottom surface of the package substrate 120. Some of the electrical connectors EC1 are bonded onto the topmost layer of the conductive patterns 126 (e.g., the ground plane), and others of the electrical connectors EC1 stands on the topmost portions of the routing structures 128, and are routed to the embedded layers of the conductive patterns 126 through the routing structures 128. The routing structures 128 may include conductive traces, conductive vias and through vias. The conductive traces respectively extend on a surface of one of the built-up dielectric layers 124 or a surface of the dielectric core layer 122. The conductive vias respectively penetrate one or more of the built-up dielectric layers 124, and are electrically connected to one or more of the conductive traces and/or one of the layers of the conductive patterns 126. In addition, the through vias penetrate through the dielectric core layer 122, and are configured to establish electrical connection between portions of the routing structures 128 at opposite sides of the dielectric core layer 122. In some embodiments, package I/Os EC2 are formed at a bottom side of the package substrate 120. Some of the package I/Os EC2 are in contact with the bottommost layer of the conductive patterns 126, while others of the package I/Os EC2 are in contact with the bottommost portions of the routing structures 128. In some embodiments, the package I/Os EC2 may be BGA balls, C4 bumps or the like.

Referring to FIG. 1A and FIG. 1B, in some embodiments, the die I/Os 102 of the bottom device die 100 further include redistribution structures RD1. In embodiments where the conductive pads AP1 are formed within a central region of the active side AS1 of the bottom device die 100, some of the conductive pads AP1 are routed to a peripheral region of the active side AS1 by the redistribution structures RD1. In this way, the die I/Os 102 of the bottom device die 100 can be distributed within both of the central region and the peripheral region of the active side AS1. As an example, the conductive pads AP1 may be arranged in two columns within the central region, and the conductive pads AP1 in each column are alternately connected to the redistribution structure RD1 extending to the peripheral region. However, those skilled in the art may modify configuration of the conductive pads AP1 and the redistribution structures RD1 according to design needs, as long as the die I/Os 102 of the bottom device die 100 can be distributed within both of the central region and the peripheral region of the active side AS1 of the bottom device die 100. In some embodiments, the redistribution structures RD1 respectively include a conductive line CL1 and a redistribution pad RP1. It should be noted that, only the redistribution pads RP1 of the redistribution structures RD1 are depicted in FIG. 1A, the conductive lines CL1 are omitted from illustration in FIG. 1A. On the other hand, the conductive lines CL1 and the redistribution pads RP1 are both shown in FIG. 1B. The conductive line CL1 extends from one of the conductive pads AP1 to one of the redistribution pads RP1. In some embodiments, the conductive line CL1 extends from a surface of the corresponding conductive pad AP1 exposed at the active side AS1, and is in lateral contact with the corresponding redistribution pad RP1. The conductive line CL1 may be formed as a straight line. Alternatively, the conductive line CL1 may have at least one turn along its extending direction. In addition, the electrical connectors EC1 may be formed on the redistribution pads RP1 as well as the conductive pads AP1 not connected to the redistribution structures RD1. In those embodiments where some of the conductive pads AP1 are routed from the central region of the active side AS1 to the peripheral region of the active side AS1, the electrical connectors EC1 are overlapped with both of the central and peripheral regions of the active side AS1.

Referring to FIG. 1A, in some embodiments, the semiconductor package 10 further includes an additional package substrate 130. In those embodiments where the active side AS2 of the top device die 110 faces away from the bottom device die 100, the additional package substrate 130 is disposed on the top device die 110. Conductive components in the additional package substrate 130 (e.g., the conductive patterns 134 as to be described) are electrically connected to some of the conductive pads AP2 of the top device die 110, and are functioned as additional voltage supply sources for the top device die 110. In some embodiments, the additional package substrate 130 is attached onto the top device die 110 via an adhesive material AM2. In addition, in embodiments where the conductive pads AP2 are located within a central region of the active side AS2 of the top device die 110, the additional package substrate 130 has an opening W overlapped with at least some of the conductive pads AP2. It should be noted that, although the additional package substrate 130 is depicted in FIG. 1A as having two separated sub-portions, these sub-portions connect with each other and laterally surround the opening W. As similar to the additional package substrate 130, a body portion of the adhesive material AM2 may laterally surrounds an opening of the adhesive material AM2, and such opening is overlapped with the opening W of the additional package substrate 130. Although inner and outer sidewalls of the adhesive material AM2 are depicted as being coplanar with inner and outer sidewalls of the additional package substrate 130, the inner and outer sidewalls of the adhesive material AM2 may alternatively recess or protrude from the inner and outer sidewalls of the additional package substrate 130.

In some embodiments, the additional package substrate 130 is a core-less package substrate. In these embodiments, the additional package substrate 130 includes built-up dielectric layers 132 and layers of conductive patterns 134. The built-up dielectric layers 132 and the layers of the conductive patterns 134 are alternately stacked along a vertical direction. In those embodiments where the additional package substrate 130 has the opening W, the opening W penetrates through the built-up dielectric layers 132 and the layers of the conductive patterns 134. The layers of the conductive patterns 132 may include at least one ground plane and at least one power plane. For instance, the layers of the conductive patterns 132 includes a single ground plane and multiple power planes (e.g., three power planes) lying under the ground plane. In addition, the additional package substrate 130 may further include routing structures 136 and bonding pads 138. The bonding pads 138 may be disposed on the topmost built-up dielectric layer 132, along with the topmost layer of the conductive patterns 134 (e.g., the ground plane). In addition, the bonding pads 138 may be located in openings $W_{134}$ of the topmost layer of the conductive patterns 134, and spaced apart from a body portion of the topmost layer of the conductive patterns 134. Some of the layers of the conductive patterns 134 below the topmost layer of the conductive patterns 134 (e.g., the power planes) are routed to the conductive pads 138 by the routing structures 136. In some embodiments, the routing structures 136 include conductive vias each penetrating through one or more of the built-up dielectric layers 132. The layers of the conductive patterns 134 below the topmost layer of the conductive patterns 134 and above the bottommost layer of the conductive patterns 134 may be discontinuous at where the routing structures 136 pass through.

According to the embodiments described above, the package substrate 120 is a package substrate with the dielectric core layer 122, and the additional package substrate 130 is a core-less package substrate. However, in other embodiments, each of the package substrate 120 and the additional package substrate 130 is a core-less package substrate. In yet other embodiments, each of the package substrate 120 and the additional package substrate 130 is a package substrate with a dielectric core layer. Alternatively, the package substrate 120 is a core-less package substrate, while the additional package substrate 130 is a package substrate with a dielectric core layer. The package substrate having a dielectric core layer, which is made of a rigid material, may have improved mechanical strength, while the core-less package substrate may have advantages such as light weight and low z-height. Those skilled in the art may select suitable substrate type(s) for the package substrate 120 and the additional package substrate 130 according to process requirements, the present disclosure is not limited thereto.

Figure 1C:
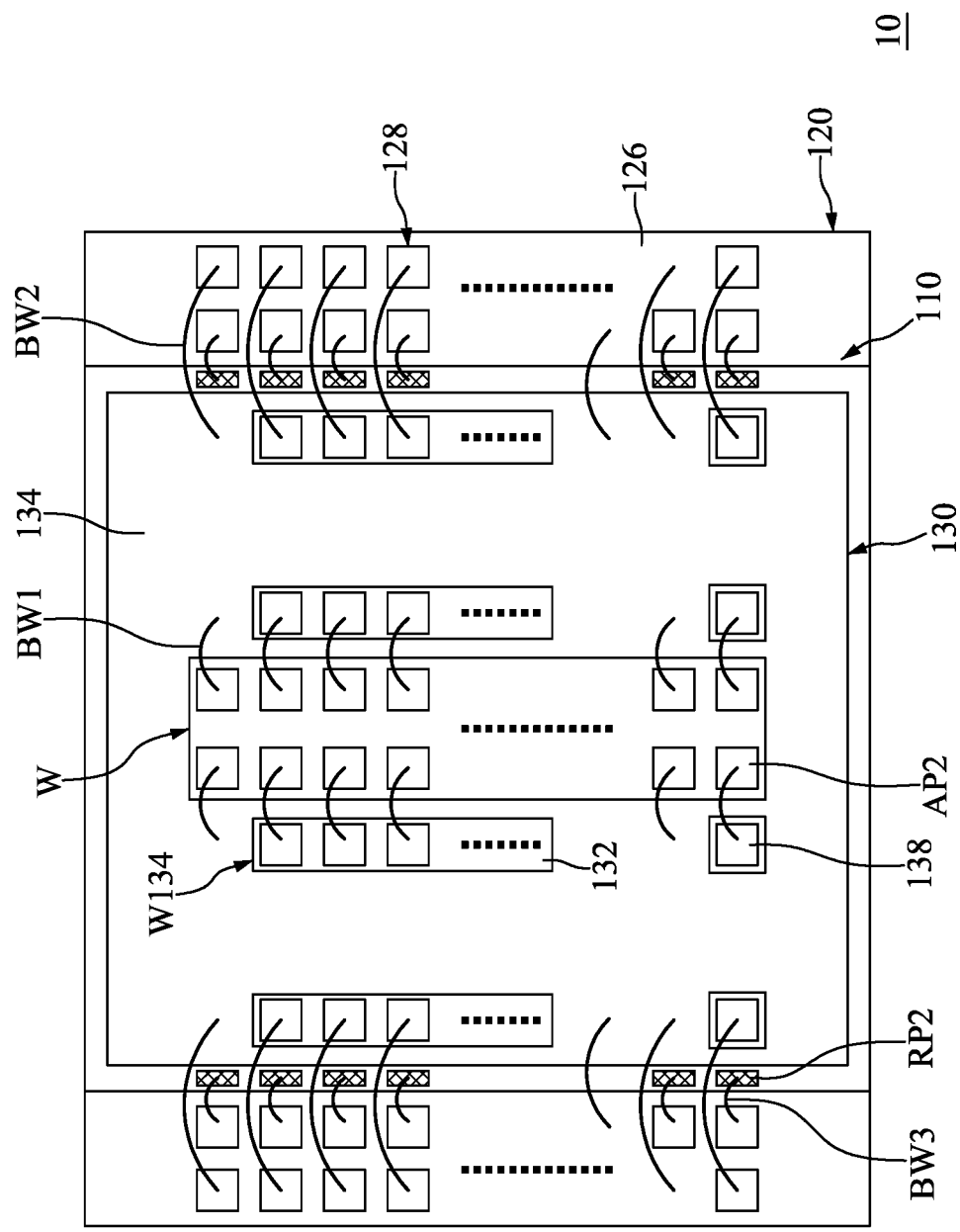
FIG. 1C is a schematic plan view of the semiconductor package as shown in FIG. 1A.

Referring to FIG. 1A and FIG. 1C, in some embodiments, the opening W of the additional package substrate 130 is laterally surrounded by a body portion of the additional package substrate 130. In such embodiments, the body portion of the additional package substrate 130 has an outer edge defining an outer boundary of the additional package substrate 130, and has an inner edge defining a contour of the opening W. The openings $W_{134}$ of the topmost layer of the conductive pattern 134 may respectively be close to the outer edge or the inner edge of the additional package substrate 130. For instance, as shown in FIG. 1C, some of the openings $W_{134}$ are arranged close to the outer edge of the additional package substrate 130, while other of the openings $W_{134}$ are arranged close to the inner edge of the additional package substrate 130. In addition, one or more of the bonding pads 138 is/are formed in each of the openings $W_{134}$. The opening $W_{134}$ in which more than one of the bonding pads 138 are located may have a footprint area greater than a footprint area of the opening $W_{134}$ in which a single one of the bonding pads 138 is located.

In some embodiments, the topmost layer of the conductive patterns 134 and some of the bonding pads 138 are electrically connected to the conductive pads AP2 of the top device die 110 that are overlapped with the opening W by bonding wires BW1. In addition, the topmost layer of the conductive patterns 134 and others of the bonding pads 138 are electrically connected to the package substrate 120 by bonding wires BW2. In some embodiments, the bonding wires BW1 extend to the conductive pads AP2 of the top device die 110 from the bonding pads 138 and a portion of the topmost layer of the conductive patterns 134 (e.g., the ground plane) that are close to the inner edge of the additional package substrate 130 (i.e., the contour of the opening W). On the other hand, the bonding wires BW2 extend to the topmost layer of the conductive patterns 126 and the topmost portions of the routing structures 128 of the package substrate 120 from the bonding pads 138 and a portion of the topmost layer of the conductive patterns 134 that are close to the outer edge of the additional package substrate 130. In this way, the bonding wires BW1 are connected with an inner peripheral region of the additional package substrate 130, while the boning wires BW2 are connected with an outer peripheral region of the additional package substrate 130. In some embodiments, power voltages (e.g., DC voltages) and a reference voltage can be provided to the top device die 110 by the power and ground planes in the additional package substrate 130 through the bonding wires BW1, and the power and ground planes in the additional package substrate 130 are electrically coupled to the power and ground planes in the package substrate 120 by the bonding wires BW2. In addition, since a vertical distance from the additional package substrate 130 to the top device die 110 is shorter than a vertical distance from the additional package substrate 130 to the package substrate 120, the bonding wires BW1 connecting between the additional package substrate 130 and the top device die 110 may have a length shorter than a length of the bonding wires BW2 connecting between the additional package substrate 130 and the package substrate 120.

Figure 1D:
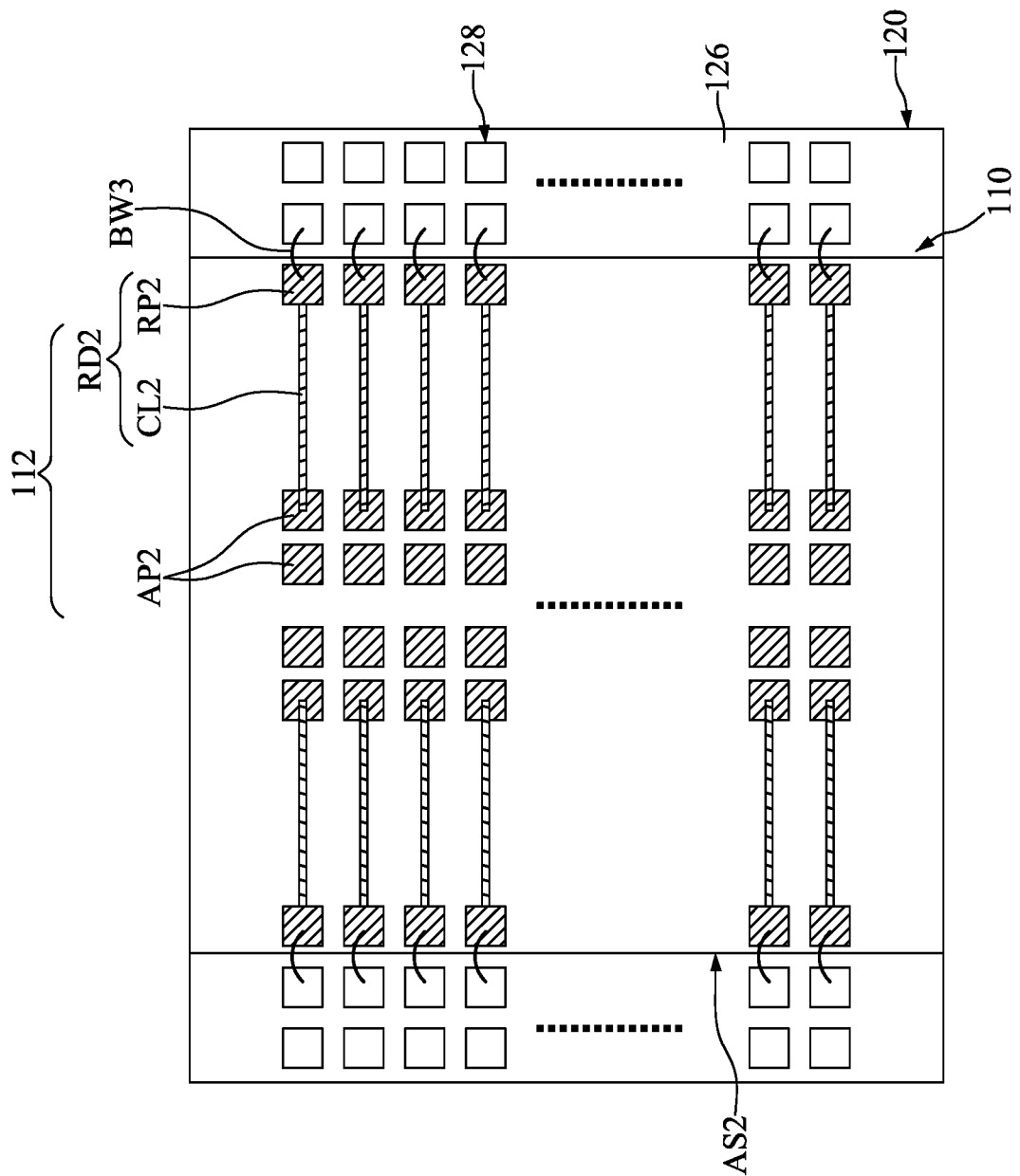
FIG. 1D is a schematic plan view of an active side of a top device die in the semiconductor package as shown in FIG. 1A.

Referring to FIG. 1C and FIG. 1D, in some embodiments, the die I/Os 112 of the top device die 110 further include redistribution structures RD2. In embodiments where the conductive pads AP2 are formed within a central region of the active side AS2 of the top device die 110, some of the conductive pads AP2 are routed to a peripheral region of the active side AS2 by the redistribution structures RD2. In this way, the die I/Os 112 of the top device die 110 can be distributed within both of the central region and the peripheral region of the active side AS2. The conductive pads AP2 not routed by the redistribution structures RD2 may be overlapped with the opening W of the additional package substrate 130, and connected to the additional package substrate 130 by, for example, the bonding wires BW1 (as shown in FIG. 1C). On the other hand, the conductive pads AP2 routed by the redistribution structures RD2 may be covered by the body portion of the additional package substrate 130 (as shown in FIG. 1A). In some embodiments, a footprint area of the top device die 110 is greater than a footprint area of the additional package substrate 130, such that the redistribution structures RD2 within the peripheral region of the top device die 110 may be at least partially located outside the span of the additional package substrate 130, thus can be used for establishing electrical connection between the top device die 110 and the package substrate 120. As an example, the conductive pads AP2 may be arranged as multiple columns within the central region. Columns of the conductive pads AP2 rather distant from the peripheral region of the active side AS2 may not be routed by the redistribution structures RD2, while columns of the conductive pads AP2 rather close to the peripheral region of the active side AS2 may be routed to the peripheral region by the redistribution structures RD2. However, those skilled in the art may modify configuration of the conductive pads AP2 and the redistribution structures RD2 according to design needs, the present disclosure is not limited thereto.

In some embodiments, the redistribution structures RD2 respectively include a conductive line CL2 and a redistribution pad RP2. It should be noted that, only the redistribution pads RP2 of the redistribution structures RD2 are depicted in FIG. 1A, the conductive lines CL2 are omitted from illustration in FIG. 1A. In addition, conductive lines CL2 are not shown in FIG. 1C since the conductive lines CL2 are covered by the body portion of the additional package substrate 130. On the other hand, the conductive lines CL2 and the redistribution pads RP2 are both shown in FIG. 1D. The conductive line CL2 extends from one of the conductive pads AP2 to one of the redistribution pads RP2. In some embodiments, the conductive line CL2 extends from a surface of the corresponding conductive pad AP2 exposed at the active side AS2, and is in lateral contact with the corresponding redistribution pad RP2. The conductive line CL2 may be formed as a straight line. Alternatively, the conductive line CL2 may have at least one turn along its extending direction.

In some embodiments, the redistribution structure RD2 within the peripheral region of the top device die 110 are connected to the package substrate 120 by bonding wires BW3. The bonding wires BW3 may respectively extend from one of the redistribution pads RP2 to a topmost portion of the routing structures 128 of the package substrate 120, in order to establish electrical connection between the top device die 110 and the package substrate 120. In some embodiments, commands for controlling the integrated circuit in the top device die 110 may be provided to the top device die 110 through the bonding wires BW3. Since a vertical distance between the top device die 110 and the package substrate 120 is shorter than a vertical distance between the additional package substrate 130 and the package substrate 120, the bonding wires BW3 connecting between the top device die 110 and the package substrate 120 may have a length shorter than the bonding wires BW2 connecting between the additional package substrate 130 and the package substrate 120. In addition, the length of the bonding wires BW3 may be shorter than, identical with or longer than the bonding wires BW1.

Referring to FIG. 1A, in some embodiments, the semiconductor package 10 further includes an encapsulant 140. The encapsulant 140 encapsulates the components disposed on the package substrate 120. In other words, the bottom device die 100, the top device die 110, the additional package substrate 130 as well as the electrical connectors EC1, the bonding wires BW1, BW2, BW3 and the adhesive materials AM1, AM2 are encapsulated by the encapsulant 140. In some embodiments, a sidewall of the encapsulant 140 is substantially coplanar with a sidewall of the package substrate 120. The encapsulant 140 includes a molding compound, such as epoxy resin. In some embodiments, the encapsulant 140 further includes filler particles (not shown) dispersed in the molding compound. The filler particles may be made of an inorganic material (e.g., silica), and are configured to modify a material property of the encapsulant 140 (e.g., coefficient of thermal expansion (CTE)).

As described above, the semiconductor package 10 according to some embodiments of the present disclosure is a dual die semiconductor package, and includes the package substrate 120, the bottom device die 100 bonded on the package substrate 120, the top device die 110 attached on the bottom device die 100 and the additional package substrate attached on the top device die 110. By disposing the additional package substrate 130, additional power plane and additional ground plane can be provided for the top device die 110. As compared to the power plane and ground plane formed in the package substrate 120, these additional power plane and ground plane in the additional package substrate 130 are closer to the top device die 110. Therefore, power and reference voltages can be provided to the top device die 110 by the additional package substrate 130 with fewer loss. Accordingly, performance of the top device die 110 can be improved.

Figure 2:
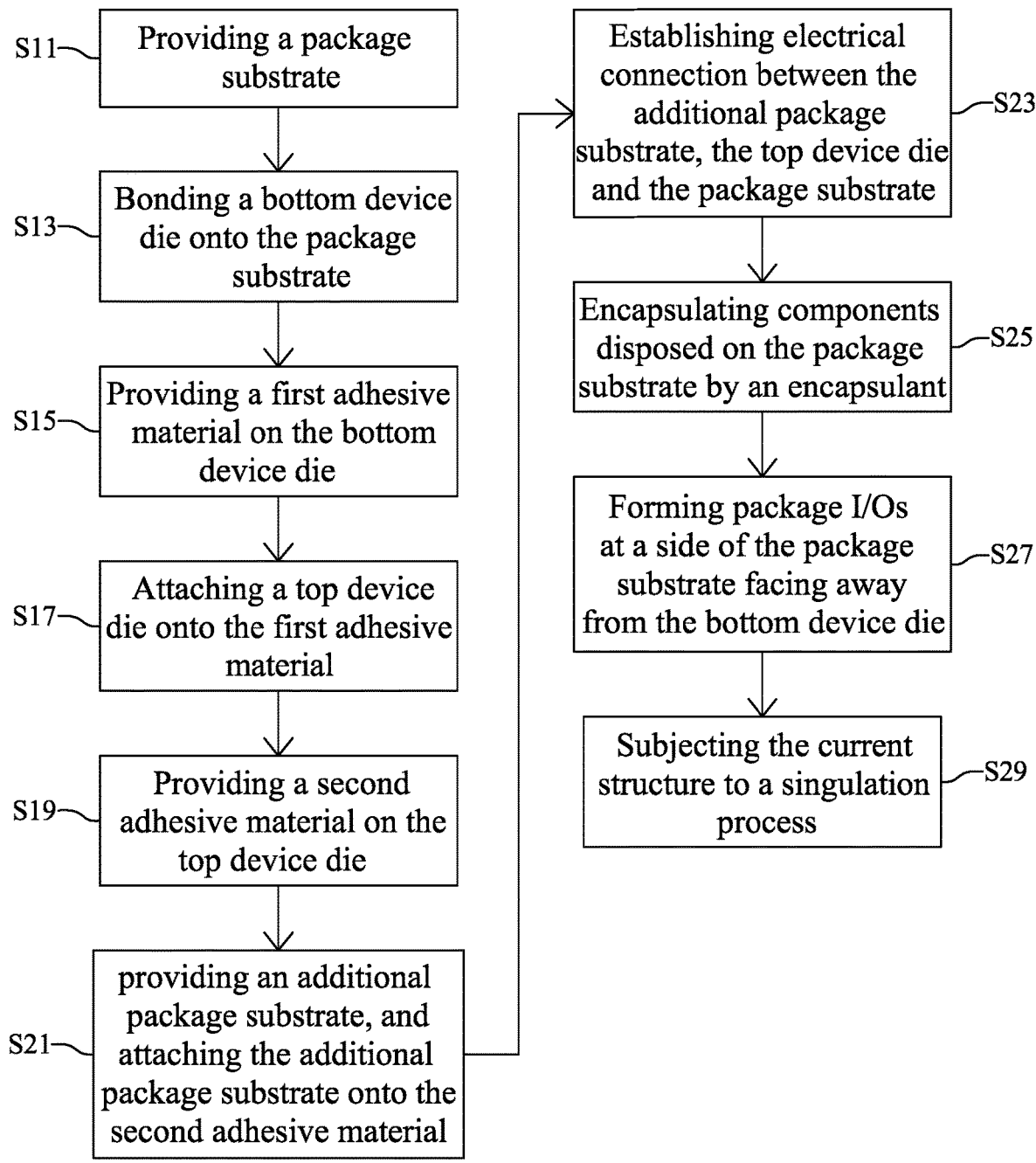
FIG. 2 is a flow diagram of a manufacturing method for forming the semiconductor package shown in FIG. 1A.

FIG. 2 is a flow diagram of a manufacturing method M10 for forming the semiconductor package 10 shown in FIG. 1A. FIG. 3A through FIG. 3I are schematic cross-sectional views illustrating structures at various stages during the manufacturing process of the semiconductor package 10 shown in FIG. 2.

Figure 3A:
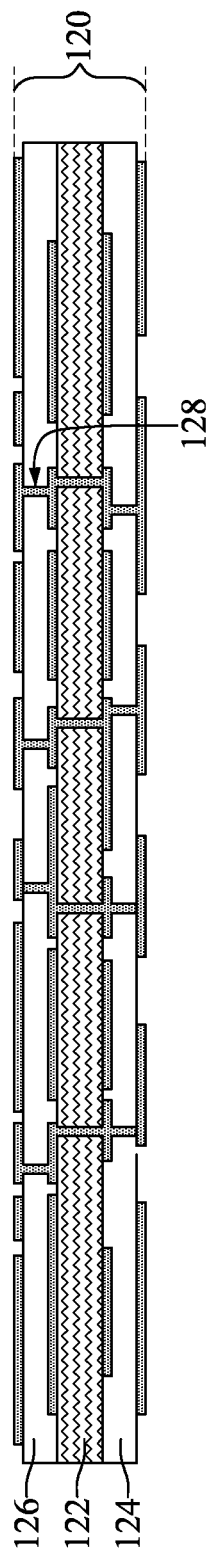
FIG. 3A through FIG. 3I are schematic cross-sectional views illustrating structures at various stages during the manufacturing process of the semiconductor package shown in FIG. 2.

Referring to FIG. 2 and FIG. 3A, step S11 is performed, and the package substrate 120 is provided. In those embodiments where the package substrate 120 is a package substrate with a dielectric core layer (e.g., the dielectric core layer 122), the built-up dielectric layers 124 and the layers of the conductive patterns 126 are formed at opposite sides of the dielectric core layer 122. In addition, the conductive vias and conductive traces of the routing structures 128 are formed along with the layers of the conductive patterns 126, and the through vias of the routing structures 128 may be formed in the dielectric core layer 122. In some embodiments, a method for forming each built-up dielectric layer 124 includes a lamination process, and a method for forming each layer of the conductive patterns 126 include a lithography process as well as a plating process or a deposition process. In addition, in some embodiments, a method for forming the through vias of the routing structures 128 includes forming through holes in the dielectric core layer 122 by a drilling process (e.g., a laser drilling process), and filling a conductive material into these through holes to form the through vias by a plating process or a deposition process. In those embodiments where the package substrate 120 is a core-less package substrate, a method for forming such package substrate may be similar to the method for forming the additional package substrate 130 as to be described with reference to FIG. 3F.

Figure 3B:
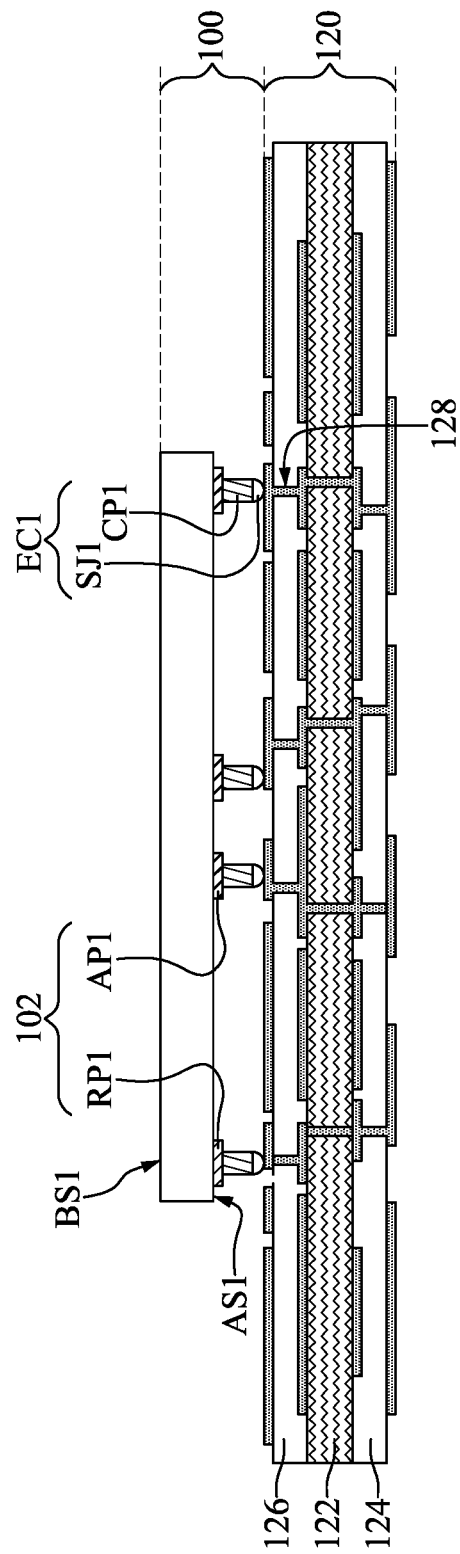

Referring to FIG. 2 and FIG. 3B, step S13 is performed, and the bottom device die 100 is bonded onto the package substrate 120. In some embodiments, the bottom device die 100 is bonded onto the package substrate 120 via a flip chip bonding manner. In such embodiments, the electrical connectors EC1 may be pre-formed on the die I/Os 102 of the bottom device die 100, and the bottom device die 100 is bonded onto the package substrate 120 through the electrical connectors EC1. After the bottom device die 100 is bonded onto the package substrate 120, the electrical connectors EC1 may be in contact with the topmost layer of the conductive patterns 126 and the topmost portions of the routing structures 128 in the package substrate 120, and electrical connection between the bottom device die 100 and the conductive patterns 126 can be established. In some embodiments, a pick and place process is used for attaching the bottom device die 100 to the package substrate 120. In addition, a thermal treatment may be subsequently performed for bonding the bottom device die 100 to the package substrate 120.

Figure 3C:
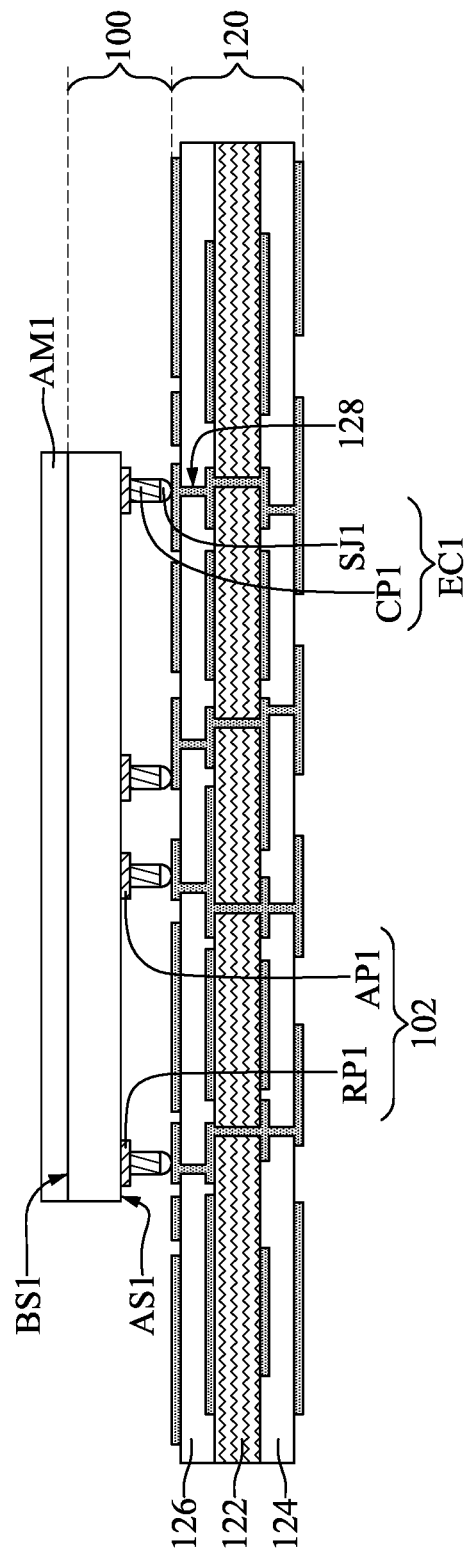

Referring to FIG. 2 and FIG. 3C, step S15 is provided, and the adhesive material AM1 is provided on the back side BS1 of the bottom device die 100. As described with reference to FIG. 1A, substantially the entire back side BS1 may be covered by the adhesive material AM1. In some embodiments, a method for forming the adhesive material AM1 includes a dispensing process.

Figure 3D:
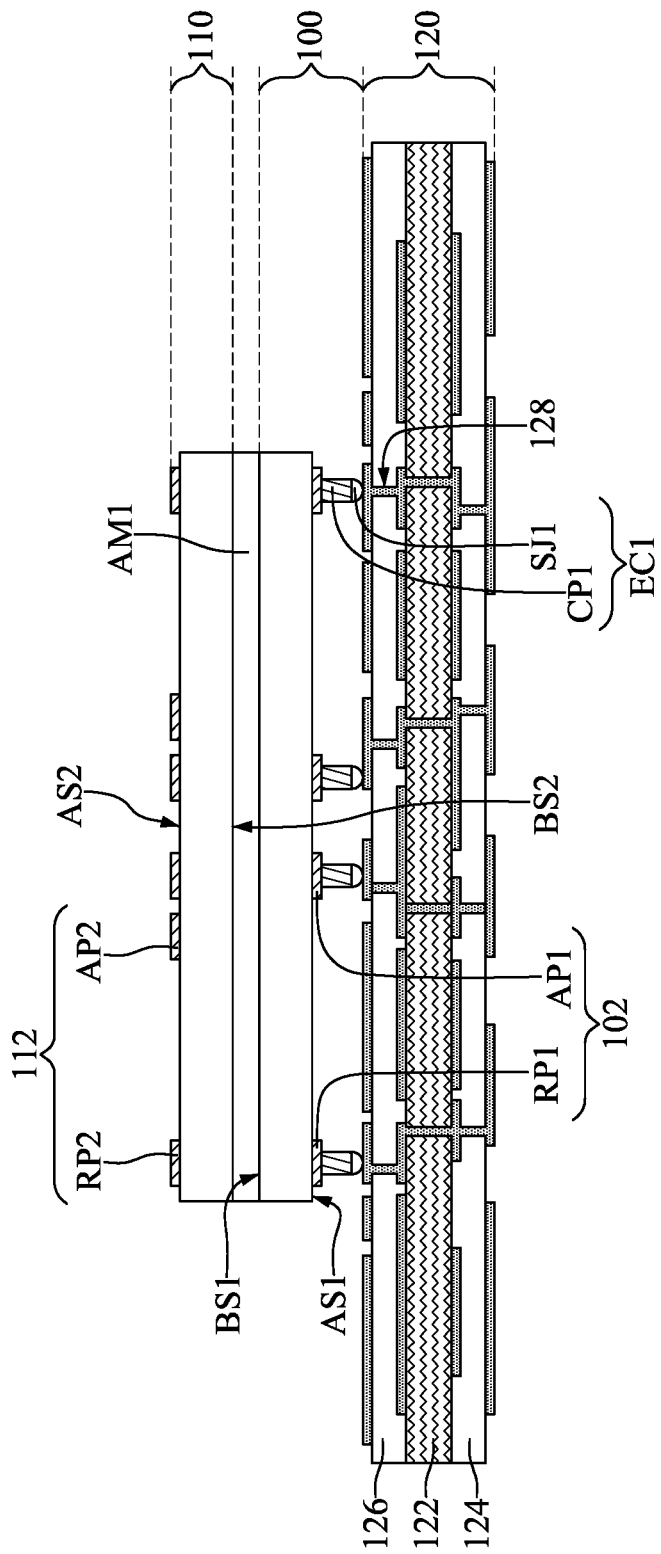

Referring to FIG. 2 and FIG. 3D, step S17 is performed, and the top device die 110 is attached onto the adhesive material AM1. Once the top device die 110 is attached onto the adhesive material AM1, the back side BS2 of the top device die 110 is in contact with the adhesive material AM1, while the active side AS2 of the top device die 110 is currently exposed. In some embodiments, a pick and place process is used for attaching the top device die 110 onto the adhesive material AM1. In addition, in some embodiments, a thermal treatment for curing the adhesive material AM1 is performed after the attachment of the top device die 110.

Figure 3E:
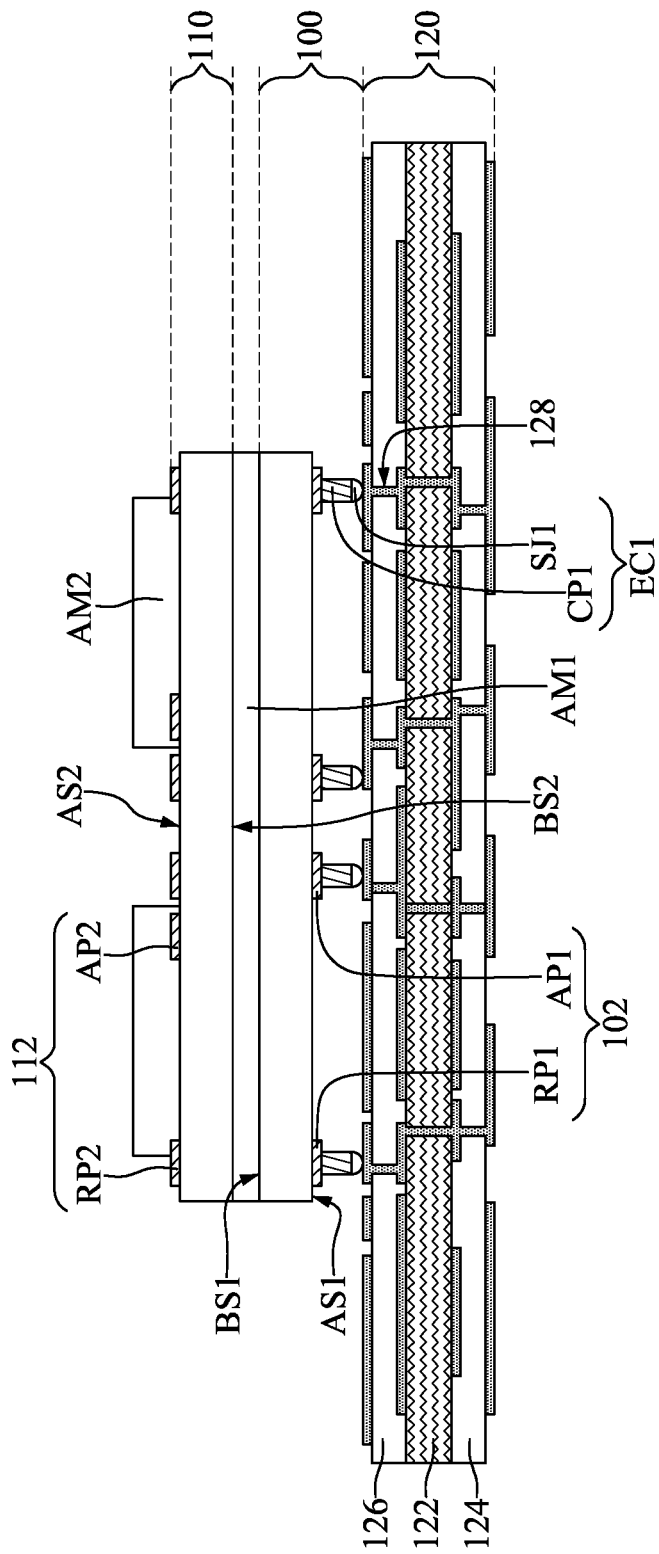

Referring to FIG. 2 and FIG. 3E, step S19 is performed, and the adhesive material AM2 is provided on the top device die 110. The adhesive material AM2 is formed on the active side AS2 of the top device die 110, such that at least some of the die I/Os 112 of the top device die 110 are covered by the adhesive material AM2. In those embodiments where the additional package substrate 130 to be attached on the adhesive material AM2 have the opening W within a central region of the additional package substrate 130 (as shown in FIG. 1C and FIG. 3E), the adhesive material AM2 may have an opening aligned with the opening W. In such embodiments, some of the conductive pads AP2 of the die I/Os 112 may be exposed in the opening of the adhesive material AM2, while others of the conductive pads AP2 are covered by a body portion of the adhesive material AM2. In addition, in some embodiments, the redistribution pads RP2 of the die I/Os 112 may respectively be partially or completely located outside the adhesive material AM2. In some embodiments, a method for forming the adhesive material AM2 includes a dispensing process.

Figure 3F:
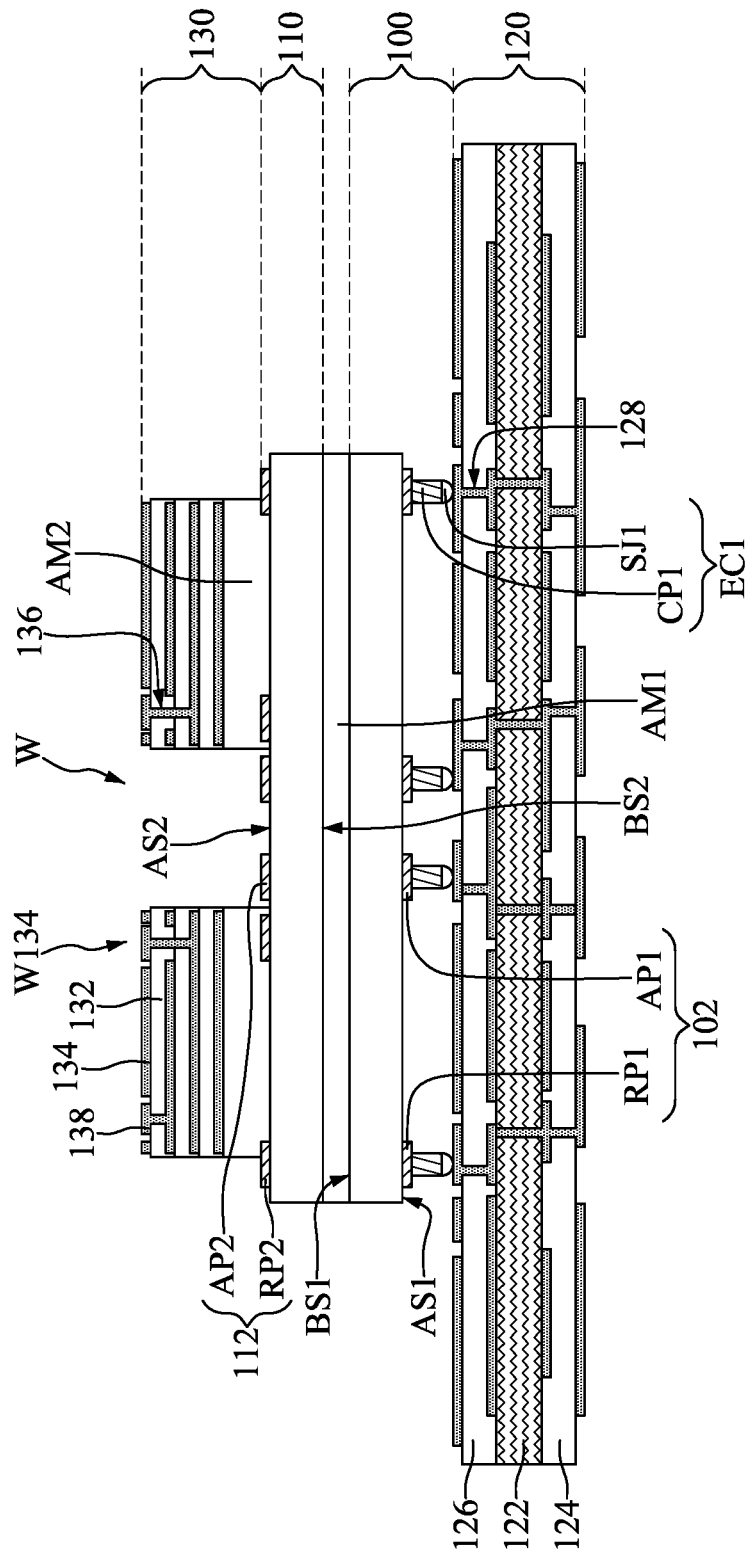

Referring to FIG. 2 and FIG. 3F, step S21 is performed, and the additional package substrate 130 is provided and attached on the adhesive material AM2. In those embodiments where the additional package substrate 130 is a core-less package substrate, a method for forming the additional package substrate 130 includes alternately forming the built-up dielectric layers 132 and the layers of the conductive patterns 134 on a carrier (not shown). A method for forming each of the built-up dielectric layers 132 may include a lamination process. In addition, a method for forming each layer of the conductive patterns 134 may include a lithography process as well as a plating process or a deposition process. In some embodiments, the routing structures 136 may be formed along with some layers of the conductive patterns 134 between the topmost and bottommost layers of the conductive patterns 134, and the bonding pads 138 may be formed along with the topmost layer of the conductive patterns 134. The built-up dielectric layers 132 may be composed of a polymer material, while the conductive patterns 134, the routing structures 136 and the bonding pads 138 may be composed of a metallic material. After formation of the built-up dielectric layers 132, the conductive patterns 134, the routing structures 136 and the bonding pads 138, the carrier is removed, and the remained structure forms the additional package substrate 130. Alternatively, the additional package substrate 130 is a package substrate with a dielectric core layer, and a method for forming such package substrate may be similar to a method for forming the package substrate 120 as described with reference to FIG. 3A. After the attachment of the additional package substrate 130, a bottom surface of the additional package substrate 130 is in contact with a top surface of the adhesive material AM2, and the topmost layer of the conductive patterns 134 as well as the bonding pads 138 are exposed. In some embodiments, the additional package substrate 130 has the opening W, and the opening W of the additional package substrate 130 may be substantially aligned with the opening of the adhesive material AM2 after the attachment of the additional package substrate 130. A pick and place process may be used for attaching the additional package substrate 130 onto the adhesive material AM2. In addition, in some embodiments, a thermal treatment for curing the adhesive material AM2 is performed after the attachment of the additional package substrate 130.

Figure 3G:
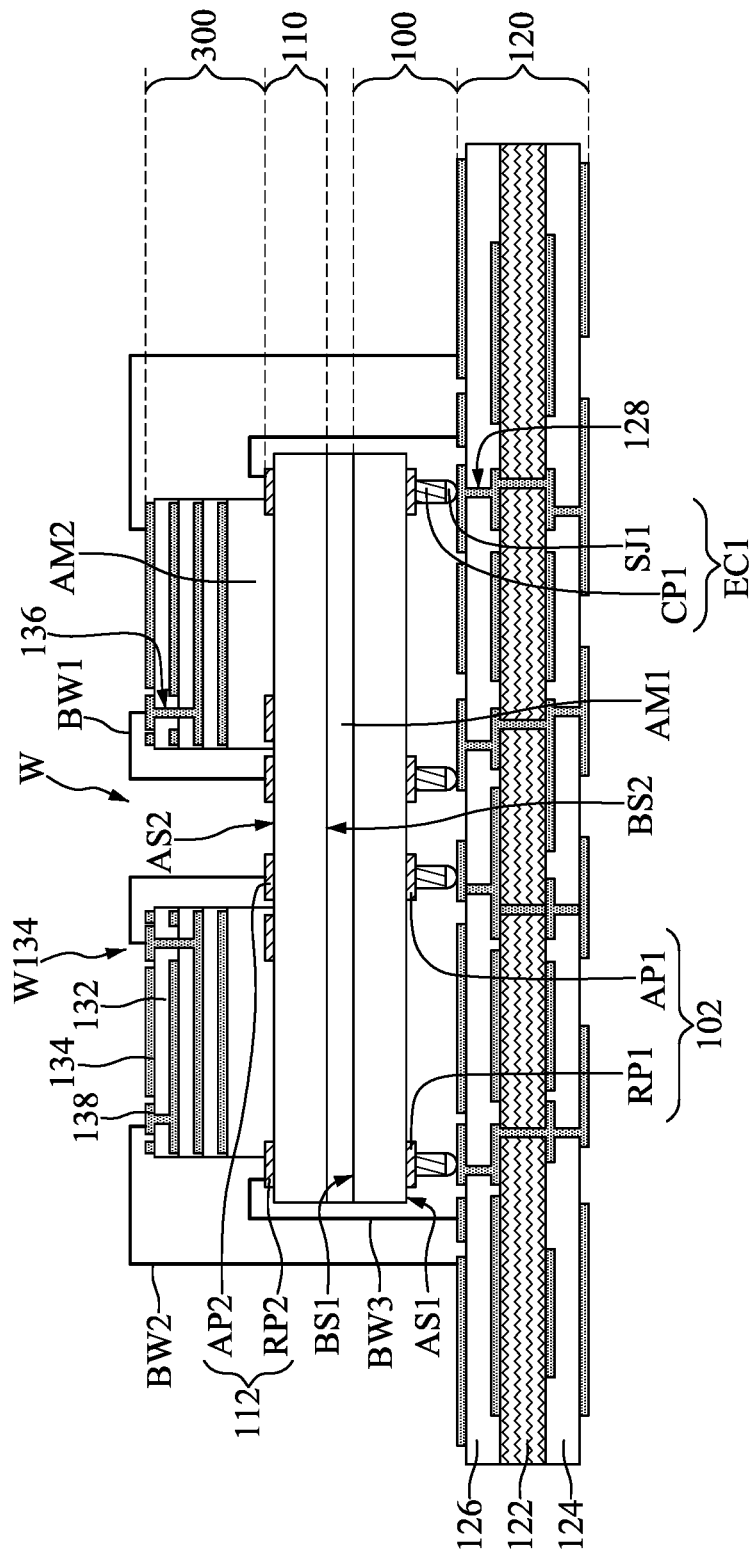

Referring to FIG. 2 and FIG. 3G, step S23 is performed, such that the additional package substrate 130 is electrically connected to the top device die 110 and the package substrate 120, and the top device die 110 is electrically connected to the package substrate 120. In some embodiments, the additional package substrate 130 is electrically connected to the top device die 110 and the package substrate 120 by the bonding wires BW1, BW2, respectively. In addition, in some embodiments, the top device die 110 is electrically connected to the package substrate 120 by the bonding wires BW3. The bonding wires BW1 may be connected with the conductive pads AP2 of the top device die 110 that are exposed in the opening W of the additional package substrate 130, while the bonding wires BW3 may be connected to the redistribution pads RP2 of the top device die 110 that are at least partially located outside the span of the additional package substrate 130. In some embodiments, the bonding wires BW1, BW2, BW3 may respectively be formed by using a wire bonding process including a solid phase welding step. Since the bonding wires BW3 extend from a relatively low altitude, formation of the bonding wires BW3 may precede formation of the bonding wires BW1, BW2. However, those skilled in the art may adjust the sequential order of the processes for forming the bonding wires BW1, BW2, BW3 according to process requirements, the present disclosure is not limited thereto.

Figure 3H:
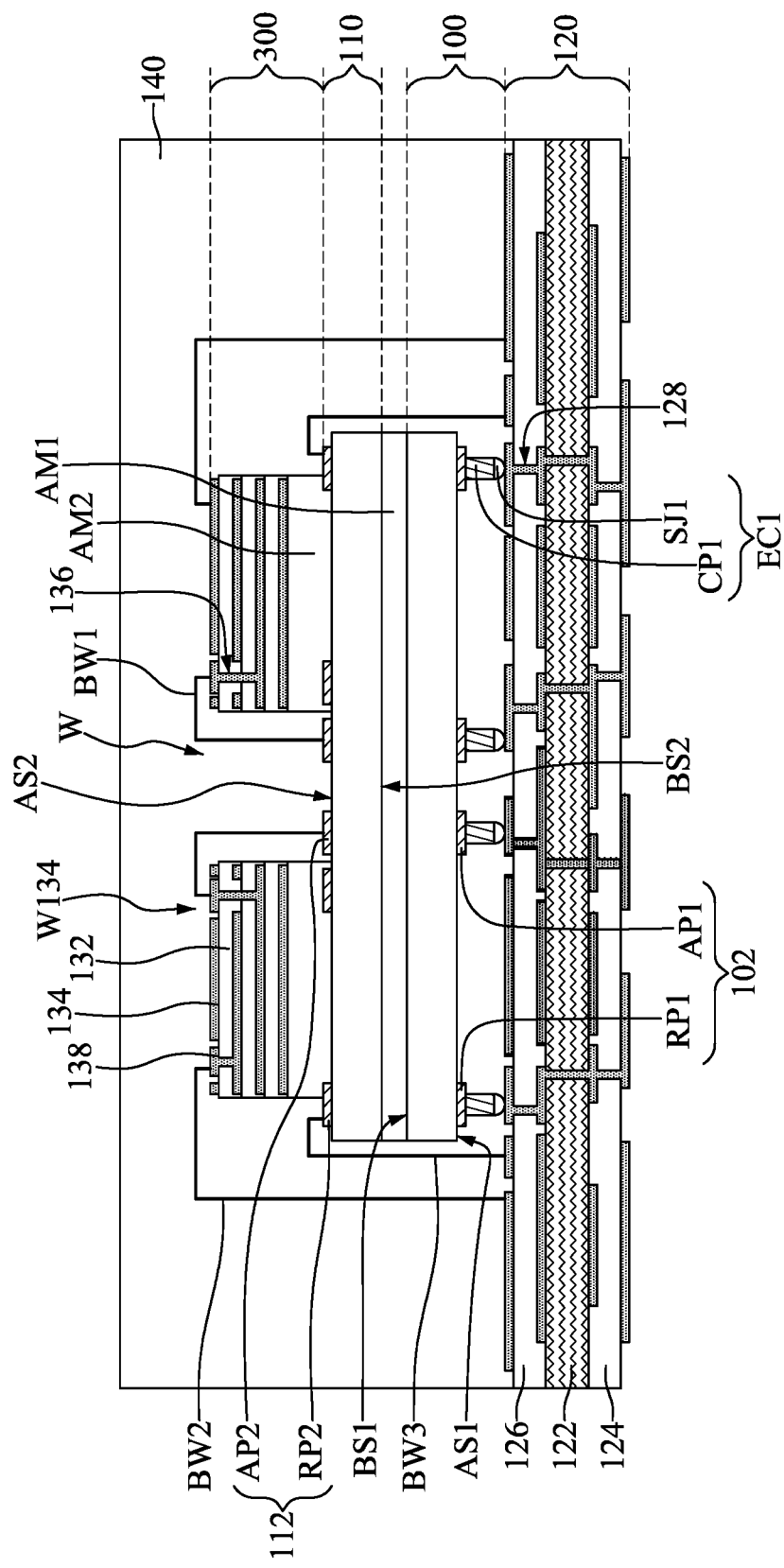

Referring to FIG. 2 and FIG. 3H, step S25 is performed, and the components disposed on the package substrate 120 are encapsulated by the encapsulant 140. In other words, the bottom device die 100, the top device die 110, the additional package substrate 130 as well as the electrical connectors EC1 and the bonding wires BW1, BW2, BW3 are encapsulated by the encapsulant 140. In some embodiments, a transfer-molding process, a compression-molding process or other viable molding process can be used for forming the encapsulant 140. In addition, in some embodiments, the as-formed encapsulant 140 may be subjected to a planarization process (e.g., a chemical mechanical polishing process), such that the encapsulant 140 may have a substantially flat top surface.

Figure 3I:
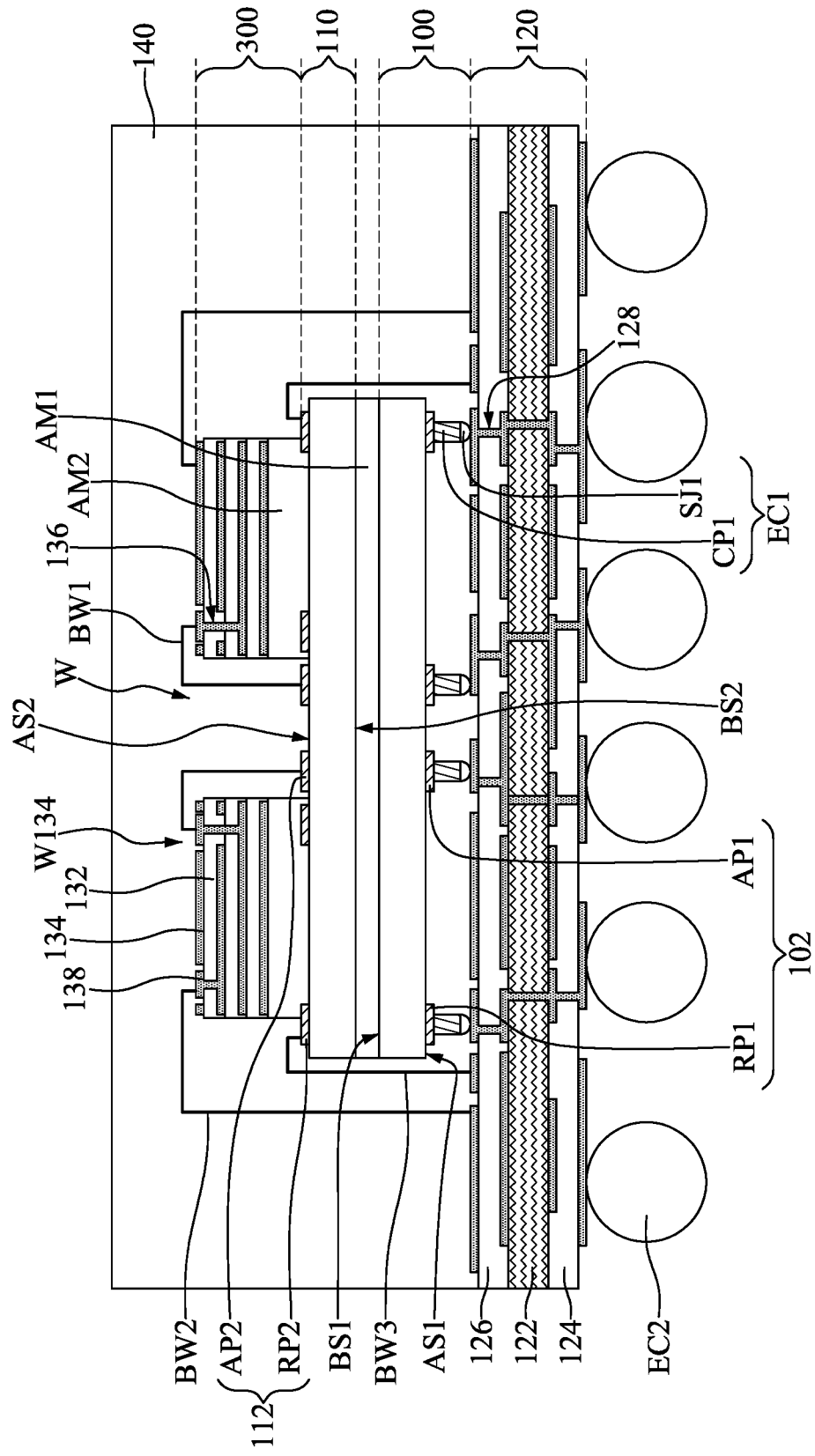

Referring to FIG. 2 and FIG. 3I, step S27 is performed, and the package I/Os EC2 are formed at a side of the package substrate 120 facing away from the bottom device die 100. In those embodiments where the package I/Os EC2 are BGA balls, a method for forming the package I/Os EC2 may include a ball placement process or a ball mount process.

Referring to FIG. 2, FIG. 3I and FIG. 1A, step S29 is performed, and the structure as shown in FIG. 3I is subjected to a singulation process. One of the singulated structures is depicted in FIG. 1A. In some embodiments, the singulation process may include a blade sawing process, a plasma dicing process or the like. In the embodiments described above, the formation of the package I/Os EC2 precedes the singulation process. However, in alternative embodiments, the singulation process may be followed by the formation of the package I/Os EC2. The present disclosure is not limited to a sequential order of these two steps.

Up to here the semiconductor package 10 is formed according to some embodiments. The semiconductor package 10 may further be subjected to other packaging process or test procedures.

Figure 4:
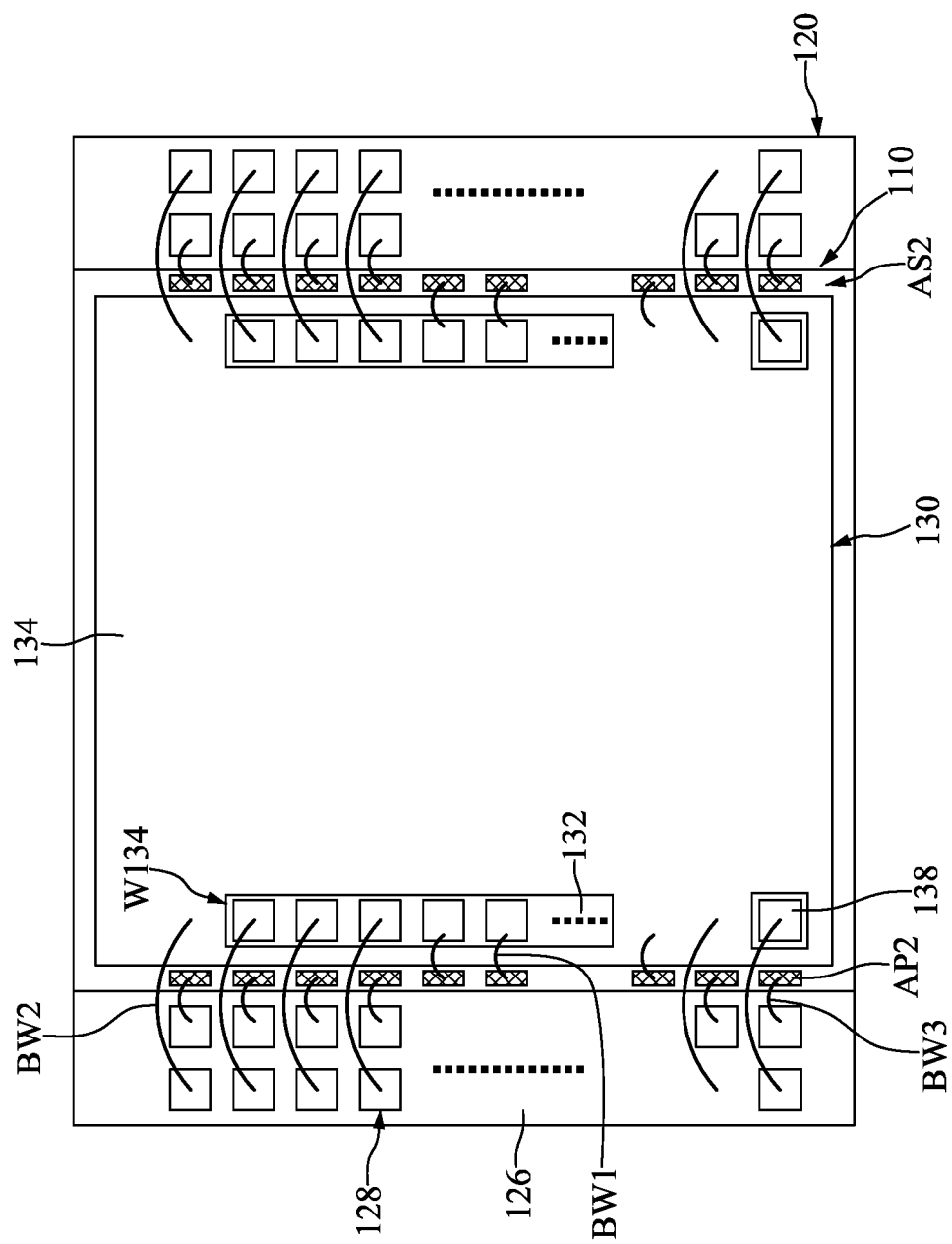
FIG. 4 is a schematic plan view of a semiconductor package according to some embodiments of the present disclosure.

FIG. 4 is a schematic plan view of a semiconductor package 20 according to some embodiments of the present disclosure. The semiconductor package 20 is similar to the semiconductor package 10 as described with reference to FIG. 1A, and only differences therebetween will be discussed, the same or the like parts would not be repeated again.

Referring to FIG. 4, in some embodiments, the conductive pads AP2 of the top device die 110 are disposed within a peripheral region of the active side AS2 of the top device die 110, and the additional package substrate 130 may not have the opening W as described with reference to FIG. 1A and FIG. 1C. In these embodiments, the die I/Os 112 of the top device die 110 may not include the redistribution structures RD2 as described with reference to FIG. 1D. In addition, the conductive pads AP2 are each partially or completely located outside a span of the additional package substrate 130, and are electrically connected to the additional package substrate 130 and the package substrate 120 through the bonding wires BW1, BW3, respectively. The bonding wires BW1 extend from the bonding pads 138 and the topmost layer of the conductive patterns 134 to some of the conductive pads AP2, such that power and reference voltages can be provided to the top device die 110 from the power and ground planes in the additional package substrate 130. In addition, the bonding wires BW3 extend from some of the conductive pads AP2 to some of the topmost portions of the routing structures 128 in the package substrate 120, such that commands for driving the integrated circuit in the top device die 110 can be transmitted to the top device die 110 from the package substrate 120. Those skilled in the art may modify configuration of the conductive pads AP2, the bonding pads 138 and the topmost portions of the routing structures 128 according to design needs, the present disclosure is not limited thereto.

Figure 5:
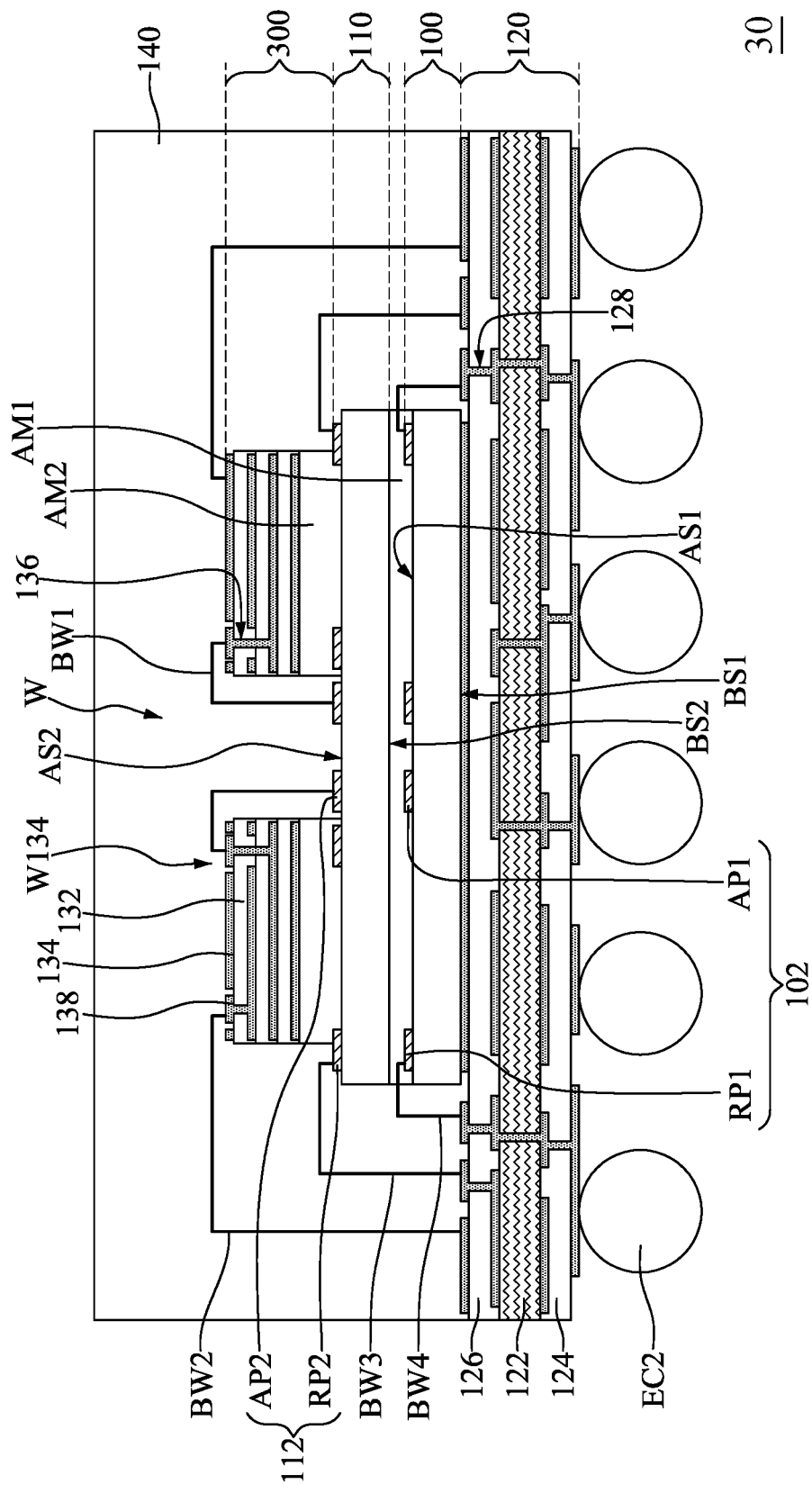
FIG. 5 is a schematic cross-sectional view of a semiconductor package according to some embodiments of the present disclosure.

FIG. 5 is a schematic cross-sectional view of a semiconductor package 30 according to some embodiments of the present disclosure. The semiconductor package 30 is similar to the semiconductor package 10 as described with reference to FIG. 1A, and only differences therebetween will be discussed, the same or the like parts would not be repeated again.

Referring to FIG. 5, in some embodiments, the back side BS1 of the bottom device die 100 faces toward the package substrate 120, while the active side AS1 of the bottom device die 100 faces away from the package substrate 120. In these embodiments, the die I/Os 102 at the active side AS1 of the bottom device die 100 may be covered by the adhesive material AM1. In addition, the redistribution pads RP1 of the die I/Os 102 may be electrically connected to the package substrate 120 by bonding wires BW4. The bonding wires BW4 may extend from the redistribution pads RP1 to the topmost layer of the conductive patterns 124 and some of the topmost portions of the routing structures 128. Moreover, the bonding wires BW4 may be partially embedded in the adhesive material AM1. A method for forming the bonding wires BW4 may be similar to the methods for forming the bonding wires BW1, BW2, BW3, and the bonding wires BW4 may be formed before the adhesive material AM1 is provided on the bottom device die 100.

Figure 6A:
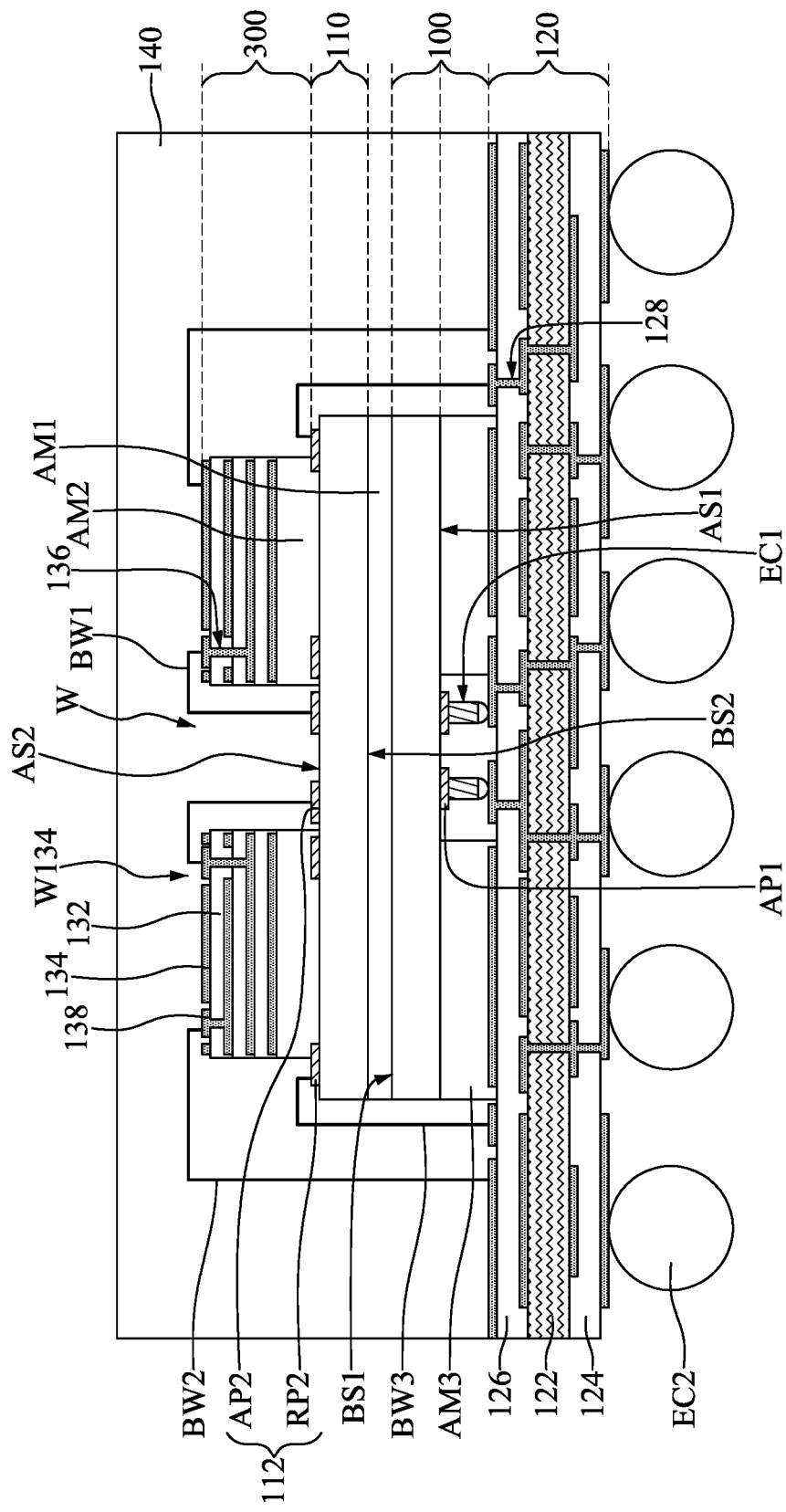
FIG. 6A is a schematic cross-sectional view of a semiconductor package according to some embodiments of the present disclosure.

FIG. 6A is a schematic cross-sectional view of a semiconductor package 40 according to some embodiments of the present disclosure. FIG. 6B is a schematic plan view the active side AS1 of the bottom device die 100 in the semiconductor package 40 as shown in FIG. 6A. The semiconductor package 40 is similar to the semiconductor package 10 as described with reference to FIG. 1A, and only differences therebetween will be discussed, the same or the like parts would not be repeated again.

Referring to FIG. 6A and FIG. 6B, in some embodiments, the redistribution structures RD1 as described with reference to FIG. 1A and FIG. 1B are omitted. In these embodiments, the die I/Os 102 of the bottom device die 100 may merely include the conductive pads AP1. In addition, an adhesive material AM3 may be disposed between the bottom device die 100 and the package substrate 120. The adhesive material AM3 may not cover the entire active side AS1 of the bottom device die 100. In those embodiments where the conductive pads AP1 are formed within a central region of the active side AS1, the adhesive material AM3 may have two separate sub-portions, and the conductive pads AP1 may be located in a space between these separate sub-portions of the adhesive material AM3. Regarding a manufacturing process of the semiconductor package 40, the adhesive material AM3 may be dispensed on the package substrate 120 before the bottom device die 100 is attached onto the package substrate 120, and a thermal treatment may be performed after the attachment of the bottom device die 100, for curing the adhesive material AM3.

Figure 7A:
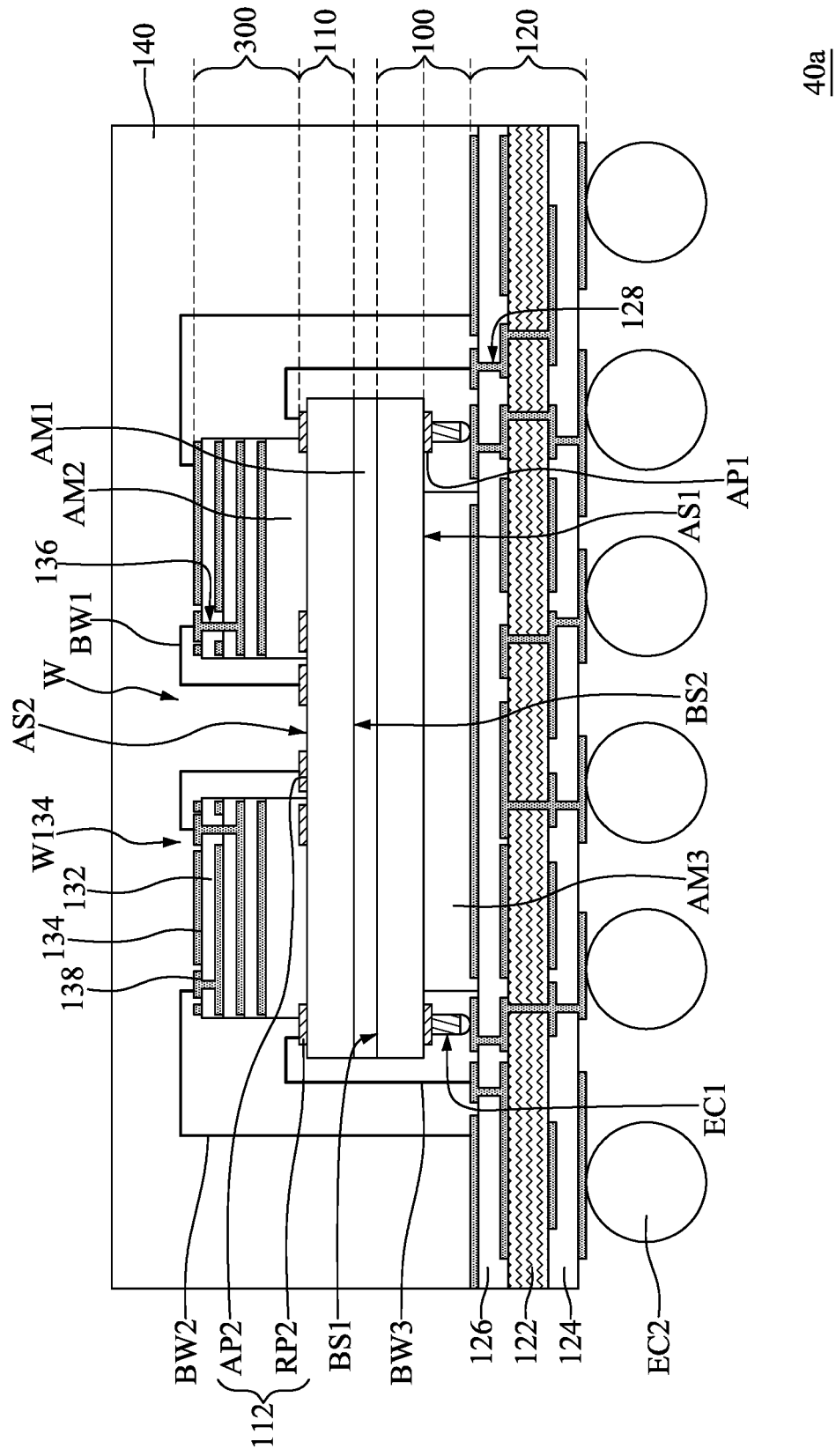
FIG. 7A is a schematic cross-sectional view of a semiconductor package according to some embodiments of the present disclosure.
Figure 7B:
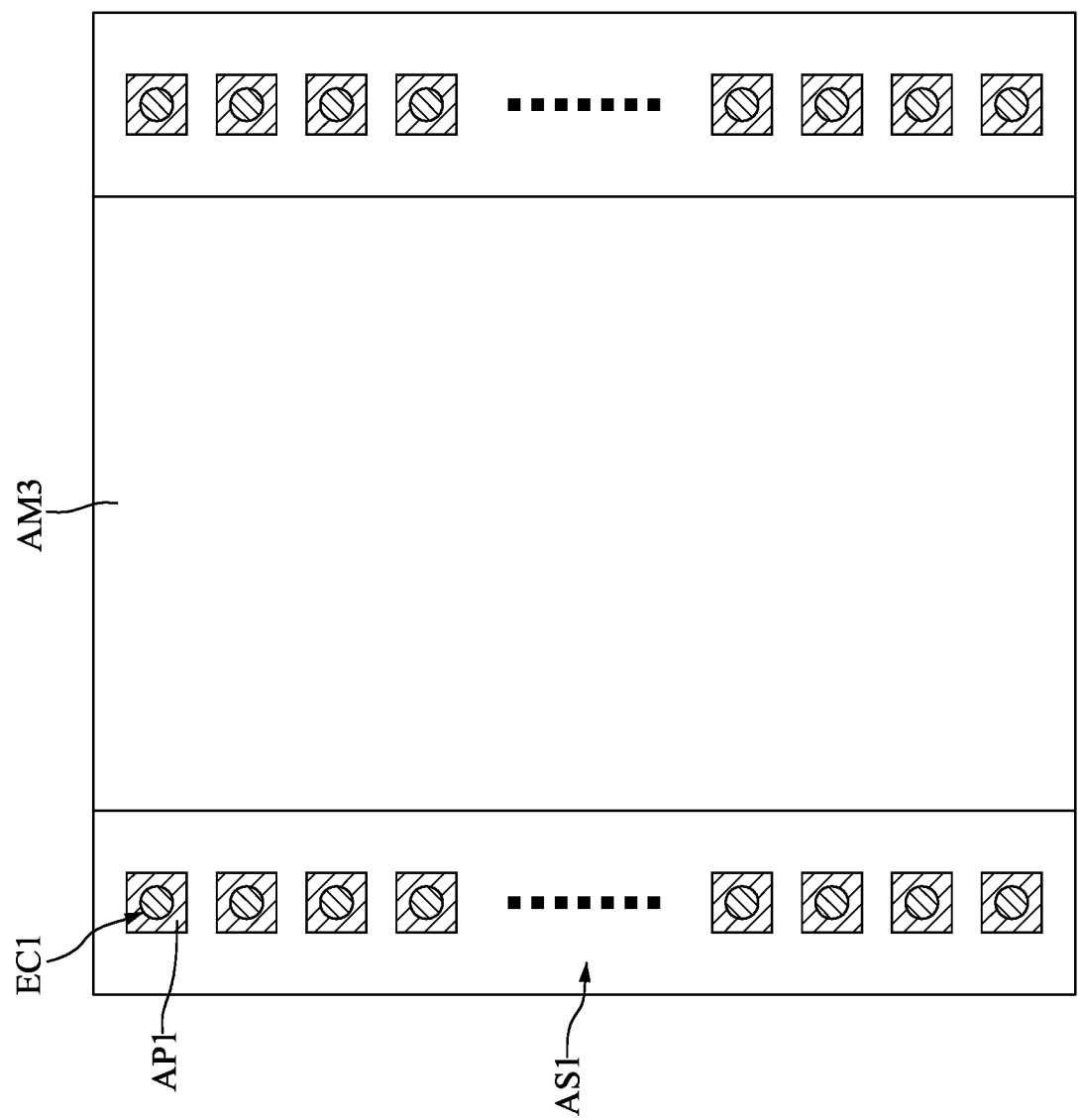
FIG. 7B is a schematic plan view an active side of a bottom device die in the semiconductor package as shown in FIG. 7A.

FIG. 7A is a schematic cross-sectional view of a semiconductor package 40a according to some embodiments of the present disclosure. FIG. 7B is a schematic plan view the active side AS1 of the bottom device die 100 in the semiconductor package 40a as shown in FIG. 7A. The semiconductor package 40a is similar to the semiconductor package 40 as described with reference to FIG. 6A and FIG. 6B, and only differences therebetween will be discussed, the same or the like parts would not be repeated again.

Referring to FIG. 7A and FIG. 7B, in embodiments where the conductive pads AP1 are formed within a peripheral region of the active side AS1 of the bottom device die 100, the conductive pads AP1 may be located at opposite sides of the adhesive material AM3. In addition, the adhesive material AM3 may be formed as a continuously spreading pattern, rather than being formed as having separate sub-portions.

As above, the semiconductor package substrate according to embodiments of the present disclosure includes an additional package substrate attached on the top device die. The additional package substrate is configured to provide power and ground planes for the top device die. As compared to the power and ground plane in the package substrate on which the bottom and top device dies are attached, these power and ground planes in the additional package substrate are closer to the top device die. Therefore, power and reference voltages can be provided to the top device die by the additional package substrate with fewer loss. Accordingly, performance of the top device die can be improved.

In an aspect of the present disclosure, a semiconductor package is provided. The semiconductor package comprises: a package substrate; a bottom device die, attached on the package substrate; a top device die, attached on the bottom device die, wherein an active side of the top device die faces away from the package substrate, a back side of the top device die faces toward the package substrate, the top device die comprises die inputs/outputs (I/Os) at the active side, and a first portion of the die I/Os are electrically connected to the package substrate; and an additional package substrate, attached on the active side of the top device die, wherein the additional package substrate is electrically connected to a second portion of the die I/Os of the top device die, and electrically connected to the package substrate.

In another aspect of the present disclosure, a semiconductor package is provided. The semiconductor package comprises: a first package substrate; a first device die, bonded onto the first package substrate, and having a first active side facing toward the first package substrate and a first back side facing away from the first active side; a second device die, attached on the first device die, and having a second active side facing away from the first device die and a second back side facing toward the first device die; a second package substrate, attached on the second active side of the second device die, wherein die inputs/outputs (I/Os) of the second device die at the second active side are electrically connected to the first and second package substrates; and an encapsulant, disposed on the first package substrate, and encapsulating the first device die, the second device die and the second package substrate.

In yet another aspect of the present disclosure, a method for preparing a semiconductor package is provided. The method comprises: bonding a bottom device die onto a package substrate; attaching a top device die onto the bottom device die; attaching an additional package substrate onto the top device die; establishing electrical connection between the additional package substrate and the top device die, between the additional package substrate and the package substrate, and between the top device die and the package substrate; and encapsulating the bottom device die, the top device die and the additional package substrate by an encapsulant.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method for preparing a semiconductor package, comprising:
   bonding a bottom device die onto a package substrate;
   attaching a top device die onto the bottom device die;

attaching an additional package substrate onto the top device die;

establishing electrical connection between the additional package substrate and the top device die, between the additional package substrate and the package substrate, and between the top device die and the package substrate;

encapsulating the bottom device die, the top device die and the additional package substrate by an encapsulant; and providing a first adhesive material on the bottom device die before the top device die is attached onto the bottom device die.

2. The method for preparing the semiconductor package according to claim 1, wherein the bottom device die is bonded onto the package substrate via a flip chip manner.

3. The method for preparing the semiconductor package according to claim 2, further comprising:

forming electrical connectors on an active side of the bottom device die before bonding the bottom device die onto the package substrate, wherein the electrical connectors connect between the active side of the bottom device die and the package substrate after the bottom device die is bonded onto the package substrate.

4. The method for preparing the semiconductor package according to claim 1, further comprising:

providing a second adhesive material on the top device die before the additional package substrate is attached onto the top device die.

5. The method for preparing the semiconductor package according to claim 1, wherein the electrical connection is established by forming bonding wires extending from the additional package to the top device die, from the additional package to the package substrate, and from the top device die to the package substrate.

\* \* \* \* \*